US007706075B2

(12) United States Patent
Yuuki

(10) Patent No.: US 7,706,075 B2
(45) Date of Patent: Apr. 27, 2010

(54) PROJECTION OPTICAL SYSTEM, EXPOSURE APPARATUS, AND DEVICE FABRICATION METHOD

(75) Inventor: Hiroyuki Yuuki, Utsunomiya (JP)

(73) Assignee: Canon Kabushiki Kaisha (JP)

( * ) Notice: Subject to any disclaimer, the term of this patent is extended or adjusted under 35 U.S.C. 154(b) by 101 days.

(21) Appl. No.: 12/176,650

(22) Filed: Jul. 21, 2008

(65) Prior Publication Data

US 2009/0027781 A1 Jan. 29, 2009

(30) Foreign Application Priority Data

Jul. 27, 2007 (JP) ............................ 2007-196588

(51) Int. Cl.
*G02B 9/00* (2006.01)
*G02B 13/14* (2006.01)
*G03B 27/42* (2006.01)

(52) U.S. Cl. .......................... 359/649; 355/53; 359/355

(58) Field of Classification Search ................... 355/53, 355/67; 359/355, 494, 497, 649

See application file for complete search history.

(56) References Cited

U.S. PATENT DOCUMENTS 7,057,708 B2 6/2006 Yamada
7,474,380 B2 * 1/2009 Yamada ....................... 355/53
2007/0035848 A1 2/2007 Schuster
2008/0043331 A1 2/2008 Kraehmer et al.
2008/0084546 A1 4/2008 Owa et al.

FOREIGN PATENT DOCUMENTS

JP 2004-045692 A 2/2004
JP 2006-113533 A 4/2006
WO WO 2004/013674 A1 2/2004
WO WO 2006/089919 A1 8/2006

* cited by examiner

*Primary Examiner*—David N Spector
(74) *Attorney, Agent, or Firm*—Rossi, Kimms & McDowell, LLP

(57) ABSTRACT

The present invention provides a projection optical system which projects an image on a first object plane onto a second object plane, comprising at least four optical members which are arrayed in turn from the second object plane, and made of an isotropic crystal, wherein the at least four optical members are formed by alternately arraying optical members in each of which a <1 1 1> crystal axis is oriented along a direction of an optical axis, and optical members in each of which a <1 0 0> crystal axis is oriented along the direction of the optical axis.

21 Claims, 19 Drawing Sheets

FIG. 5

| | 121 | 122 | 123 | 124 | 125 | 126 |
|---|---|---|---|---|---|---|
| ARRANGEMENT 1 | P1 | P2 | P3 | P4 | P5 | P6 |
| ARRANGEMENT 2 | P2 | P3 | P4 | P5 | P6 | P1 |
| ARRANGEMENT 3 | P3 | P4 | P5 | P6 | P1 | P2 |
| ARRANGEMENT 4 | P4 | P5 | P6 | P1 | P2 | P3 |
| ARRANGEMENT 5 | P5 | P6 | P1 | P2 | P3 | P4 |
| ARRANGEMENT 6 | P6 | P1 | P2 | P3 | P4 | P5 |
| ARRANGEMENT 7 | P6 | P5 | P4 | P3 | P2 | P1 |
| ARRANGEMENT 8 | P5 | P4 | P3 | P2 | P1 | P6 |
| ARRANGEMENT 9 | P4 | P3 | P2 | P1 | P6 | P5 |
| ARRANGEMENT 10 | P3 | P2 | P1 | P6 | P5 | P4 |
| ARRANGEMENT 11 | P2 | P1 | P6 | P5 | P4 | P3 |
| ARRANGEMENT 12 | P1 | P6 | P5 | P4 | P3 | P2 |

FIG. 7

| | 131 | 132 | 133 | 134 | 135 | 136 | 137 | 138 |
|---|---|---|---|---|---|---|---|---|
| ARRANGEMENT 1 | Q1 | Q2 | Q3 | Q4 | Q5 | Q6 | Q7 | Q8 |
| ARRANGEMENT 2 | Q2 | Q3 | Q4 | Q5 | Q6 | Q7 | Q8 | Q1 |
| ARRANGEMENT 3 | Q3 | Q4 | Q5 | Q6 | Q7 | Q8 | Q1 | Q2 |
| ARRANGEMENT 4 | Q4 | Q5 | Q6 | Q7 | Q8 | Q1 | Q2 | Q3 |
| ARRANGEMENT 5 | Q5 | Q6 | Q7 | Q8 | Q1 | Q2 | Q3 | Q4 |
| ARRANGEMENT 6 | Q6 | Q7 | Q8 | Q1 | Q2 | Q3 | Q4 | Q5 |
| ARRANGEMENT 7 | Q7 | Q8 | Q1 | Q2 | Q2 | Q4 | Q5 | Q6 |
| ARRANGEMENT 8 | Q8 | Q1 | Q2 | Q3 | Q4 | Q5 | Q6 | Q7 |
| ARRANGEMENT 9 | Q8 | Q7 | Q6 | Q5 | Q4 | Q3 | Q2 | Q1 |
| ARRANGEMENT 10 | Q7 | Q6 | Q5 | Q4 | Q3 | Q2 | Q1 | Q8 |
| ARRANGEMENT 11 | Q6 | Q5 | Q4 | Q3 | Q2 | Q1 | Q8 | Q7 |
| ARRANGEMENT 12 | Q5 | Q4 | Q3 | Q2 | Q1 | Q8 | Q7 | Q6 |
| ARRANGEMENT 13 | Q4 | Q3 | Q2 | Q1 | Q8 | Q7 | Q6 | Q5 |
| ARRANGEMENT 14 | Q3 | Q2 | Q1 | Q8 | Q7 | Q6 | Q5 | Q4 |
| ARRANGEMENT 15 | Q2 | Q1 | Q8 | Q7 | Q6 | Q5 | Q4 | Q3 |
| ARRANGEMENT 16 | Q1 | Q8 | Q7 | Q6 | Q5 | Q4 | Q3 | Q2 |

FIG. 9

| | NA=1.55 | | | |
|---|---|---|---|---|
| | MAXIMUM IMAGE HEIGHT=66mm | | | |
| | CURVATURE RADIUS | ON-AXIS INTERVAL | LENS MATERIAL | ORIENTATION PATTERN |
| L111 | 128.593000 | 20.920410 | LuAG | <111-00°> |
| | 131.600583 | 0.000000 | | |
| L112 | 131.600583 | 13.745197 | LuAG | <100-00°> |
| | 145.697377 | 0.000000 | | |
| L113 | 145.697377 | 18.520880 | LuAG | <111-60°> |
| | 203.704949 | 0.000000 | | |
| L114 | 203.704949 | 11.813606 | LuAG | <100-45°> |
| | FLAT | 1.000000 | | |
| | SECOND OBJECT PLANE | | | |

FIG. 12

| | NA=1.55 | | | |
|---|---|---|---|---|
| | MAXIMUM IMAGE HEIGHT=66mm | | | |
| | CURVATURE RADIUS | ON-AXIS INTERVAL | LENS MATERIAL | ORIENTATION PATTERN |
| L1110 | 128.593000 | 16.974561 | LuAG | <111-00°> |
| | 76.573767 | 0.000000 | | |
| L1120 | 76.573767 | 12.758562 | LuAG | <100-00°> |
| | 70.054424 | 0.000000 | | |
| L1130 | 70.054424 | 19.494869 | LuAG | <111-60°> |
| | 59.769554 | 0.000000 | | |
| L1140 | 59.769554 | 15.771873 | LuAG | <100-45°> |
| | FLAT | 1.000000 | | |
| | SECOND OBJECT PLANE | | | |

FIG. 15

| | NA=1.55 | | | |
|---|---|---|---|---|
| | MAXIMUM IMAGE HEIGHT=66mm | | | |
| | CURVATURE RADIUS | ON-AXIS INTERVAL | LENS MATERIAL | ORIENTATION PATTERN |
| L121 | 128.593000 | 20.732029 | LuAG | <111-00°> |
| | 130.280119 | 0.000000 | | |
| L122 | 130.280119 | 7.043601 | LuAG | <100-45°> |
| | 142.801047 | 0.000000 | | |
| L123 | 142.801047 | 10.026334 | LuAG | <111-60°> |
| | 149.812704 | 0.000000 | | |
| L124 | 149.812704 | 12.148783 | LuAG | <100-00°> |
| | 164.902160 | 0.000000 | | |
| L125 | 164.902160 | 9.019179 | LuAG | <111-60°> |
| | 308.021635 | 0.000000 | | |
| L126 | 308.021635 | 6.032559 | LuAG | <100-45°> |
| | FLAT | 1.000000 | | |
| | SECOND OBJECT PLANE | | | |

FIG. 18

| | NA=1.55 | | | |
|---|---|---|---|---|
| | MAXIMUM IMAGE HEIGHT=66mm | | | |
| | CURVATURE RADIUS | ON-AXIS INTERVAL | LENS MATERIAL | ORIENTATION PATTERN |
| L131 | 128.593000 | 9.745923 | LuAG | <111-00°> |
| | 129.555325 | 0.000000 | | |
| L132 | 129.555325 | 6.953399 | LuAG | <100-45°> |
| | 134.463929 | 0.000000 | | |
| L133 | 134.463929 | 9.817795 | LuAG | <111-60°> |
| | 139.423456 | 0.000000 | | |
| L134 | 139.423456 | 6.047386 | LuAG | <100-00°> |
| | 155.747075 | 0.000000 | | |
| L135 | 155.747075 | 9.833703 | LuAG | <111-60°> |
| | 183.737646 | 0.000000 | | |
| L136 | 183.737646 | 6.824916 | LuAG | <100-45°> |
| | 231.451115 | 0.000000 | | |
| L137 | 231.451115 | 9.770091 | LuAG | <111-00°> |
| | 613.674336 | 0.000000 | | |
| L138 | 613.674336 | 6.006873 | LuAG | <100-00°> |
| | FLAT | 1.000000 | | |
| | SECOND OBJECT PLANE | | | |

PROJECTION OPTICAL SYSTEM, EXPOSURE APPARATUS, AND DEVICE FABRICATION METHOD

BACKGROUND OF THE INVENTION

1. Field of the Invention

The present invention relates to a projection optical system, an exposure apparatus, and a device fabrication method.

2. Description of the Related Art

A projection exposure apparatus has conventionally been employed to fabricate, for example, a micropatterned semiconductor device such as a semiconductor memory or logic circuit by using photolithography. The projection exposure apparatus projects and transfers a circuit pattern formed on a reticle (mask) onto, for example, a wafer via a projection optical system.

A minimum line width (resolution) that the projection exposure apparatus can transfer is proportional to the wavelength of exposure light and is inversely proportional to the numerical aperture (NA) of the projection optical system. Along with a demand for micropatterning semiconductor devices, the wavelength of the exposure light is shortening and the NA of the projection optical system is increasing. Particularly in recent years, a projection optical system (immersion projection optical system) using an immersion exposure technique has attracted a great deal of attention as a means for increasing the NA of the projection optical system. The immersion exposure technique further increases the NA of the projection optical system by filling the space between the wafer and the final lens (final surface) of the projection optical system with a liquid.

The immersion projection optical system generally uses pure water as the liquid which fills the space between the final lens and the wafer, and uses quartz as the lens material of the final lens. From the viewpoint of design of this system, the limit of its numerical aperture is about 1.35. Under the circumstances, it is proposed to increase the numerical aperture to 1.5 or 1.65 or more by using a liquid having a refractive index higher than that of pure water and a lens material having a refractive index higher than that of quartz.

At present, LuAG ($Lu_3Al_5O_{12}$) is attracting a great deal of attention as a lens material which transmits light having a wavelength of 193 nm and a refractive index higher than that of quartz. Since, however, LuAG is a crystal lens material, it contains crystal-structure-related birefringence. The higher the refractive index of the crystal lens material, the larger the crystal-structure-related birefringence. For example, $CaF_2$ (calcium fluoride) has a refractive index of 1.506 with respect to light having a wavelength of 193 nm, and has a maximum crystal-structure-related birefringence of 3.4 nm/cm. On the other hand, LuAG has a refractive index of 2.14 with respect to light having a wavelength of 193 nm, and has a maximum crystal-structure-related birefringence of 30 nm/cm.

FIGS. 21A and 21B each show the crystal-structure-related birefringence distribution of an isotropic crystal lens material (flat shape). FIG. 21A shows the birefringence distribution around the <1 1 1> crystal axis (crystal orientation). FIG. 21B shows the birefringence distribution around the <1 0 0> crystal axis (crystal orientation). In FIGS. 21A and 21B, each position along the radial direction indicates the light beam propagation angle, and the radial direction indicates the propagation direction of the light beam. The length of each short line indicates the relative amount of birefringence, and the direction of the short line indicates the fast axis direction of birefringence.

Referring to FIGS. 21A and 21B, the crystal-structure-related birefringence of an isotropic crystal lens material is zero in the <1 0 0> crystal axis orientation and <1 1 1> crystal axis orientation, and is maximum in the <1 1 0> crystal axis orientation. Hence, when the <1 0 0> crystal axis and <1 1 1> crystal axis are oriented along the optical axis of the projection optical system, the light beam propagation angle increases as the numerical aperture increases, resulting in an increase in the crystal-structure-related birefringence.

To correct the crystal-structure-related birefringence, there has been proposed a technique of forming other lenses of the projection optical system using the same crystal lens materials as that of the final lens or crystal lens materials each having nearly the same birefringence as that in the final lens, and controlling the assembly angles of these crystal lens materials around the optical axis. Japanese Patent Laid-Open Nos. 2004-45692 and 2006-113533 propose other techniques of correcting the crystal-structure-related birefringence.

To correct the crystal-structure-related birefringence, the maximum angles between the optical axis and a light beam (propagating light beam) which propagates through the crystal lens materials are preferably, nearly equal to each other. U.S. Pre-Grant Publication No. 2007/0035848 proposes an optical system with such an arrangement.

International Publication WO 2006/089919 proposes a technique of correcting the crystal-structure-related birefringence not only by specifying the assembly angles of the crystal lens materials around the optical axis but also by arraying them in the light beam traveling direction in consideration of the order of the crystal lens materials.

Japanese Patent Laid-Open No. 2004-45692 discloses a technique of efficiently correcting the crystal-structure-related birefringence by orienting the <1 0 0> crystal axis of a crystal lens material, which exhibits a maximum angle between a propagating light beam and the optical axis of the projection optical system of 30° or more, along the optical axis of the projection optical system. However, Japanese Patent Laid-Open No. 2004-45692 does not take account of a high refractive index crystal lens material which has a very large crystal-structure-related birefringence (e.g., has a birefringence more than 20 nm/cm). It is difficult to correct the crystal-structure-related birefringence of such a high refractive index crystal lens material unless not only the condition of a crystal lens material in which the <1 0 0> crystal axis is oriented along the optical axis of the projection optical system but also that of a crystal lens material in which the <1 1 1> crystal axis is oriented along the optical axis of the projection optical system is defined.

Japanese Patent Laid-Open No. 2006-113533 discloses a technique of correcting the crystal-structure-related birefringence of a high refractive index crystal lens material by forming the final lens and lenses adjacent to it using MgO (magnesium oxide) and CaO (calcium oxide) having crystal-structure-related birefringences of opposite signs. However, Japanese Patent Laid-Open No. 2006-113533 does not show concrete arrangements of the crystal axes of MgO and CaO, which allow reduction in the crystal-structure-related birefringence. In practice, high-quality MgO and CaO which can be used for the exposure apparatus neither exist nor are under development.

U.S. Pre-Grant Publication No. 2007/0035848 (FIG. 2) discloses a technique of correcting the crystal-structure-related birefringence by arraying crystal lens materials such that the maximum angles between the optical axis and a light beam which propagates through these materials are nearly equal to each other. However, U.S. Pre-Grant Publication No. 2007/0035848 (FIG. 2) does not take account of the curvature radii of these crystal lens materials. It is difficult to correct the crystal-structure-related birefringence unless the curvature radii of these crystal lens materials are specified.

U.S. Pre-Grant Publication No. 2007/0035848 discloses a technique of correcting the crystal-structure-related birefringence by alternately arraying crystal lens materials in each of which the <1 0 0> crystal axis is oriented along the optical axis of the projection optical system, and crystal lens materials in each of which the <1 1 1> crystal axis is oriented along the optical axis of the projection optical system. However, U.S. Pre-Grant Publication No. 2007/0035848 does not take account of the array order of the crystal lens materials with respect to their assembly angles around the optical axis. When at least six or more crystal lens materials are arrayed, it is difficult to correct the crystal-structure-related birefringence unless the condition of the array order of the crystal lens materials with respect to their assembly angles around the optical axis is defined.

SUMMARY OF THE INVENTION

The present invention provides a projection optical system which attains an excellent imaging performance by reducing the adverse influence of crystal-structure-related birefringence.

According to one aspect of the present invention, there is provided a projection optical system which projects an image on a first object plane onto a second object plane, comprises at least four optical members which are arrayed in turn from the second object plane, and made of an isotropic crystal, wherein the at least four optical members are formed by alternately arraying optical members in each of which a <1 1 1> crystal axis is oriented along a direction of an optical axis, and optical members in each of which a <1 0 0> crystal axis is oriented along the direction of the optical axis, when the at least four optical members are determined as a first optical member, a second optical member, a third optical member, and a fourth optical member in turn from the first object plane, maximum angles θ1, θ2, θ3, and θ4 between the optical axis and a light beam which propagates through the first optical member, the second optical member, the third optical member, and the fourth optical member satisfy: $|\theta i - \theta j| < 5°$ (i, j=1, 2, 3, 4), and a curvature radius R1 of a surface of the first optical member on a side of the first object plane, a curvature radius R2 of a surface of the second optical member on the side of the first object plane, a curvature radius R3 of a surface of the third optical member on the side of the first object plane, and a curvature radius R4 of a surface of the fourth optical member on the side of the first object plane satisfy: $R1<R2<R3<R4$.

Further features of the present invention will become apparent from the following description of exemplary embodiments with reference to the attached drawings.

BRIEF DESCRIPTION OF THE DRAWINGS

FIG. 5 is a table showing an example of the arrangements of the necklace permutation of the orientation patterns for respective optical members in the projection optical system shown in FIG. 3.

FIG. 7 is a table showing an example of the arrangements of the necklace permutation of the orientation patterns for respective optical members in the projection optical system shown in FIG. 6.

FIG. 9 is a table showing a numerical specification table of the projection optical system according to the first embodiment of the present invention.

FIG. 12 is a table showing a numerical specification table of the projection optical system shown in FIG. 11.

FIG. 15 is a table showing a numerical specification table of the projection optical system according to the second embodiment of the present invention.

FIG. 18 is a table showing a numerical specification table of the projection optical system according to the third embodiment of the present invention.

DESCRIPTION OF THE EMBODIMENTS

Figure 1:
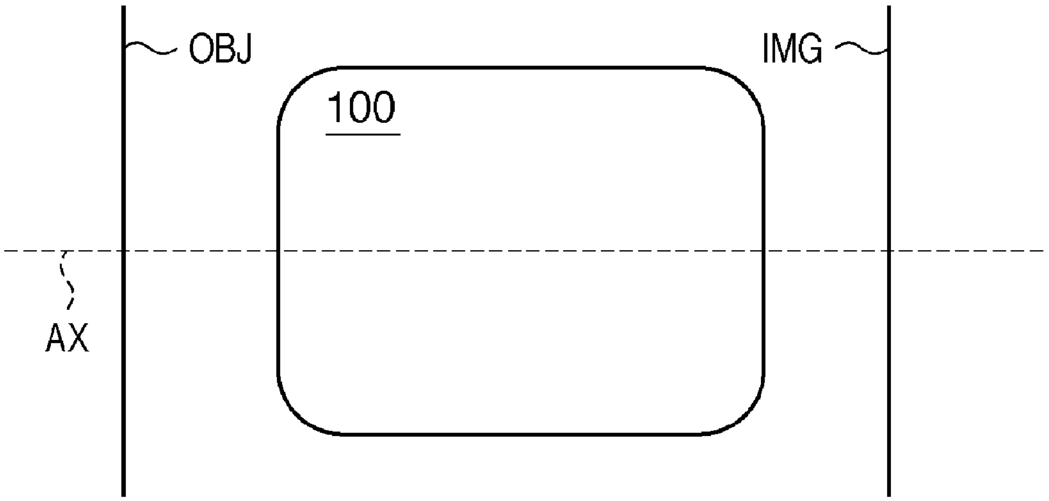
FIG. 1 is a view showing the entire arrangement of a projection optical system according to one aspect of the present invention.

Preferred embodiments of the present invention will be described below with reference to the accompanying drawings. The same reference numerals denote the same members throughout the drawings, and a repetitive description thereof will not be given.

Figure 2:
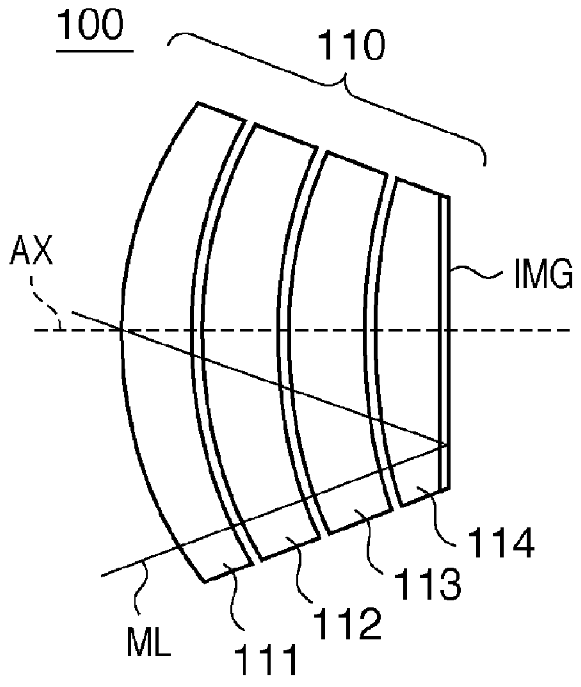
FIG. 2 is a schematic sectional view showing an example of the arrangement of the projection optical system shown in FIG. 1.

FIG. 1 is a view showing the entire arrangement of a projection optical system 100 according to one aspect of the present invention. FIG. 2 is a schematic sectional view showing an example of the arrangement of the projection optical system 100. FIG. 2 shows optical members (lenses) of the projection optical system 100 near a second object plane IMG. In FIG. 1, reference symbol AX indicates the optical axis of the projection optical system 100, reference symbol OBJ indicates a first object plane corresponding to the reticle surface, and reference symbol IMG indicates a second object plane corresponding to the wafer surface.

The projection optical system 100 projects an image (of the reticle pattern) on the first object plane OBJ onto the second object plane IMG, and includes at least four optical members arrayed in turn from the second object plane IMG, as shown in FIG. 2. In this embodiment, the projection optical system 100 includes an optical member (first optical member) 111, optical member (second optical member) 112, optical member (third optical member) 113, and optical member (fourth optical member) 114 in turn from the first object plane OBJ. The projection optical system 100 is an immersion projection optical system in which the space between the optical member 114 and the second object plane IMG is filled with a liquid having a high refractive index.

The optical members 111 to 114 are made of an isotropic crystal (e.g., LuAG) having a high refractive index, and form a final lens (lens group) 110. The <1 1 1> crystal axes of two of the optical members 111 to 114 are oriented along the optical axis AX, while the <1 0 0> crystal axes of the remaining two of them are oriented along the optical axis AX. When two members in each of which the <1 1 1> crystal axis is oriented along the optical axis are assembled around the optical axis at different relative angles, it is possible to cancel and reduce asymmetrical components of the pupil birefringence distribution. When two members in each of which the <1 0 0> crystal axis is oriented along the optical axis are assembled around the optical axis at different relative angles, it is possible to cancel and reduce rotationally symmetrical components of the pupil birefringence distribution, which reinforce each other in the two members in each of which the <1 1 1> crystal axis is oriented along the optical axis. In this manner, the use of at least two optical members in each of which the <1 1 1> crystal axis is oriented along the optical axis AX, and at least two optical members in each of which the <1 0 0> crystal axis is oriented along the optical axis AX allows to cancel crystal-structure-related birefringences generated in these optical members. Alternately arraying optical members in each of which the <1 1 1> crystal axis is oriented along the optical axis AX, and those in each of which the <1 0 0> crystal axis is oriented along the optical axis AX also makes it possible to cancel birefringences generated in these optical members.

Optical members in each of which the <1 1 1> crystal axis is oriented along the optical axis AX, and those in each of which the <1 0 0> crystal axis is oriented along the optical axis AX are preferably arrayed such that angles ξ between the optical axis AX and the crystal axes of the respective optical members satisfy:

$$|\xi|<2° \quad (1)$$

If the angles ξ between the optical axis AX and the crystal axes are too large to satisfy relation (1), the symmetry of the pupil birefringence distribution of a light beam corresponding to each image point generated in each optical member deteriorates. This reduces the effect of correcting crystal-structure-related birefringence generated in the final lens 110 by specifying the assembly angles of the optical members 111 to 114, and therefore makes it difficult to satisfactorily cancel birefringences in these optical members. In other words, it is possible to efficiently correct crystal-structure-related birefringence generated in the final lens 110 by arraying the optical members 111 to 114 such that relation (1) is satisfied.

The curvature radii of the surfaces of the optical members 111 to 114 on the first object plane side in the projection optical system 100 shown in FIG. 2 satisfy:

$$R1<R2<R3<R4 \quad (2)$$

where R1 is the curvature radius of the surface of the optical member 111 on the first object plane side, R2 is the curvature radius of the surface of the optical member 112 on the first object plane side, R3 is the curvature radius of the surface of the optical member 113 on the first object plane side, and R4 is the curvature radius of the surface of the optical member 114 on the first object plane side.

When the projection optical system 100 shown in FIG. 2 satisfies the above-described condition with regard to the optical members 111 to 114, it can cancel crystal-structure-related birefringences more than 20 nm/cm even if they are contained in the optical members 111 to 114. In other words, the projection optical system 100 can reduce crystal-structure-related birefringences generated in the four optical members 111 to 114.

The maximum angles between the optical axis AX and a light beam ML in the optical members 111 to 114 of the projection optical system 100 shown in FIG. 2 preferably satisfy:

$$|\theta i-\theta j|<5° \ (i, j=1, 2, 3, 4) \quad (3)$$

where θ1 is the maximum angle between the optical axis AX and the light beam ML in the optical member 111, θ2 is the maximum angle between the optical axis AX and the light beam ML in the optical member 112, θ3 is the maximum angle between the optical axis AX and the light beam ML in the optical member 113, and θ4 is the maximum angle between the optical axis AX and the light beam ML in the optical member 114.

In this case, it is possible to reduce crystal-structure-related birefringences generated in the four optical members 111 to 114. Note that the light beam ML is a light beam at a maximum image height, which forms a maximum angle with the optical axis AX, of light beams (propagating light beams) which propagate through the optical members 111 to 114.

When the optical members 111 to 114 are made of an isotropic crystal, the amount of crystal-structure-related birefringence generation differs between the angles (propagating light beam angles) of a light beam which propagates through the optical members 111 to 114. When the <1 1 1> or <1 0 0> crystal axis is oriented along the optical axis AX, the amount of birefringence generation increases as the propagating light beam angle increases. If the differences in angles between the optical axis AX and a light beam which propagates through the optical members 111 to 114 increase (i.e., relation (3) is not satisfied), the amount of pupil birefringence of a light beam corresponding to each image point generated in each optical member increases. This reduces the effect of correcting birefringence generated in the final lens 110 by specifying the crystal axes and assembly angles of the optical members 111 to 114, and therefore makes it difficult to satisfactorily cancel birefringences in these optical members. On the other hand, if relation (3) is satisfied, it is possible to efficiently correct crystal-structure-related birefringence generated in the final lens 110, as described above.

Figure 3:
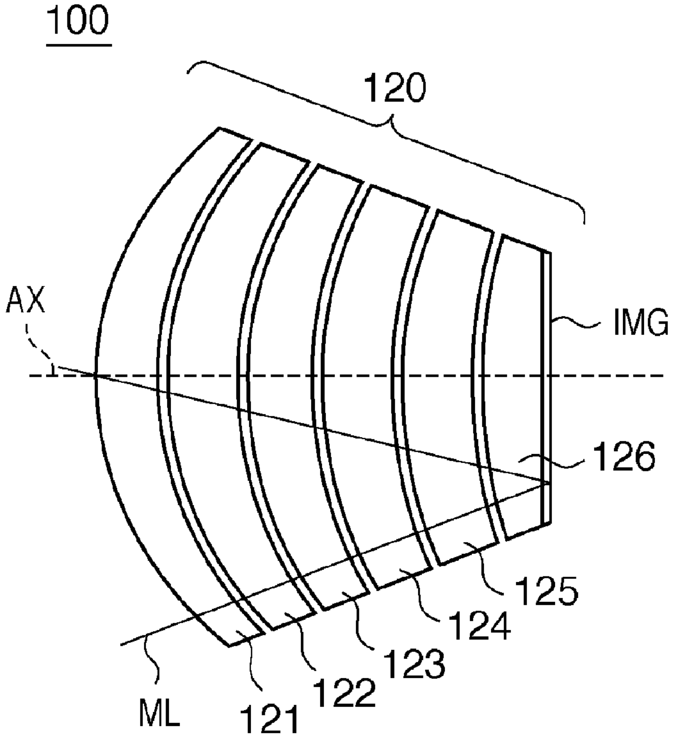
FIG. 3 is a schematic sectional view showing another example of the arrangement of the projection optical system shown in FIG. 1.

Another example of the arrangement of the projection optical system 100 will be explained next with reference to FIG. 3. FIG. 3 is a schematic sectional view showing another example of the arrangement of the projection optical system 100. FIG. 3 shows optical members (lenses) of the projection optical system 100 near the second object plane IMG.

The projection optical system 100 includes at least six optical members arrayed in turn from the second object plane IMG, as shown in FIG. 3. In this embodiment, the projection optical system 100 includes an optical member (first optical member) 121, optical member (second optical member) 122, optical member (third optical member) 123, optical member (fourth optical member) 124, optical member (fifth optical member) 125, and optical member (sixth optical member) 126 in turn from the first object plane OBJ. The projection optical system 100 is an immersion projection optical system in which the space between the optical member 126 and the second object plane IMG is filled with a liquid having a high refractive index.

The optical members 121 to 126 are made of an isotropic crystal (e.g., LuAG) having a high refractive index, and form a final lens (lens group) 120. The <1 1 1> crystal axes of three of the optical members 121 to 126 are oriented along the optical axis AX, while the <1 0 0> crystal axes of the remaining three of them are oriented along the optical axis AX. Alternately arraying optical members in each of which the <1 1 1> crystal axis is oriented along the optical axis AX, and those in each of which the <1 0 0> crystal axis is oriented along the optical axis AX makes it possible to cancel birefringences generated in these optical members.

Figure 21A:
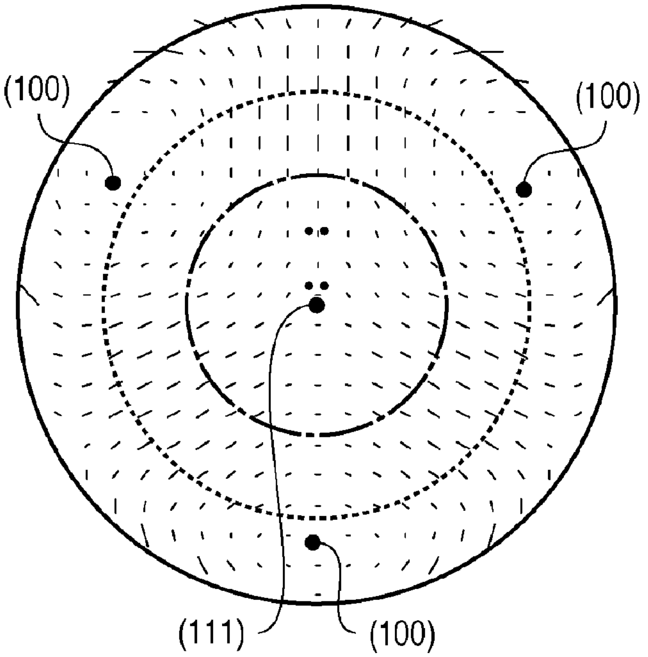
FIGS. 21A and 21B are diagrams each showing the crystal-structure-related birefringence distribution of an isotropic crystal lens material.
Figure 21B:
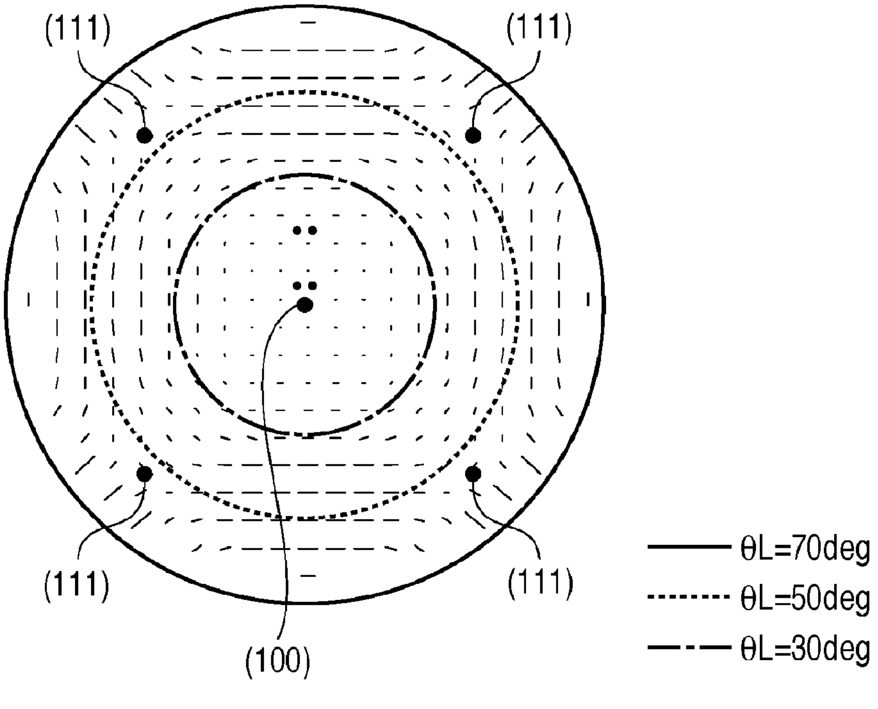

The angles (relative angles) of the optical members 121 to 126 around the optical axis in the projection optical system 100 shown in FIG. 3 satisfy:

$$\Phi 2 = \Phi 6 + m \times \eta \pm 5^\circ$$

$$\Phi 3 = \Phi 5 + n \times \eta \pm 5^\circ \quad (4)$$

where Φ1 is the angle (relative angle) of the optical member 121 around the optical axis, Φ2 is the angle (relative angle) of the optical member 122 around the optical axis, Φ3 is the angle (relative angle) of the optical member 123 around the optical axis, Φ4 is the angle (relative angle) of the optical member 124 around the optical axis, Φ5 is the angle (relative angle) of the optical member 125 around the optical axis, Φ6 is the angle (relative angle) of the optical member 126 around the optical axis, and m and n are integers. Note that η is 120° for optical members (the optical members 122 and 126 in the upper equation of relation (4)), and the optical members 123 and 125 in the lower equation of relation (4)) in each of which the <1 1 1> crystal axis is oriented along the optical axis AX, and η is 90° for optical members in each of which the <1 0 0> crystal axis is oriented along the optical axis AX. This is because, referring to FIG. 21A, the crystal-structure-related birefringence distribution of an optical member in which the <1 1 1> crystal axis is oriented along the optical axis is identical between before and after its rotation about the <1 1 1> crystal axis as the center through 120°, that is, it has 120° rotational symmetry. Likewise, this is also because, referring to FIG. 21B, the crystal-structure-related birefringence distribution of an optical member in which the <1 0 0> crystal axis is oriented along the optical axis is identical between before and after its rotation about the <1 0 0> crystal axis as the center through 90°, that is, it has 90° rotational symmetry. In other words, relation (4) represents that the optical members 122 and 126 have the nearly same crystal axis orientation, and the optical members 123 and 125 have nearly the same crystal axis orientation.

Consider a case in which the angular difference in crystal axis orientation between the optical members 122 and 126, and that between the optical members 123 and 125 are relatively large. In this case, the symmetry of crystal-structure-related birefringences in the optical members 122 and 126, and that in the optical members 123 and 125 deteriorate. This reduces the effect of correcting crystal-structure-related birefringence generated in the final lens 120 by specifying the assembly angles of the optical members 121 to 126, and therefore makes it difficult to satisfactorily cancel birefringences in these optical members.

Consider a case in which the relative angular difference in crystal axis orientation around the optical axis between the optical members 122 and 126, and that between the optical members 123 and 125 are set within the range of ±5°, as shown in relation (4). In this case, the symmetry of crystal-structure-related birefringences in the optical members 122 and 126, and that in the optical members 123 and 125 are maintained. It is therefore possible to efficiently correct crystal-structure-related birefringence generated in the final lens (lens group) 120.

When the projection optical system 100 shown in FIG. 3 satisfies the above-described condition with regard to the optical members 121 to 126, it can cancel crystal-structure-related birefringences more than 20 nm/cm even if they are contained in the optical members 121 to 126. In other words, the projection optical system 100 can reduce crystal-structure-related birefringences generated in the six optical members 121 to 126.

The curvature radii of the surfaces of the optical members 121 to 126 on the first object plane side in the projection optical system 100 shown in FIG. 3 preferably satisfy:

$$R1 < R2 < R3 < R4 < R5 < R6 \quad (5)$$

where R1 is the curvature radius of the surface of the optical member 121 on the first object plane side, R2 is the curvature radius of the surface of the optical member 122 on the first object plane side, R3 is the curvature radius of the surface of the optical member 123 on the first object plane side, R4 is the curvature radius of the surface of the optical member 124 on the first object plane side, R5 is the curvature radius of the surface of the optical member 125 on the first object plane side, and R6 is the curvature radius of the surface of the optical member 126 on the first object plane side.

In this case, it is possible to reduce crystal-structure-related birefringences generated in the six optical members 121 to 126.

The maximum angles between the optical axis AX and a light beam ML in the optical members 121 to 126 of the projection optical system 100 shown in FIG. 3 preferably satisfy:

$$|\theta i - \theta j| < 5^\circ \ (i, j = 1, 2, 3, 4, 5, 6) \quad (6)$$

where θ1 is the maximum angle between the optical axis AX and the light beam ML in the optical member 121, θ2 is the maximum angle between the optical axis AX and the light beam ML in the optical member 122, θ3 is the maximum angle between the optical axis AX and the light beam ML in the optical member 123, θ4 is the maximum angle between the optical axis AX and the light beam ML in the optical member 124, θ5 is the maximum angle between the optical axis AX and the light beam ML in the optical member 125, and θ6 is the maximum angle between the optical axis AX and the light beam ML in the optical member 126.

In this case, it is possible to reduce crystal-structure-related birefringences generated in the six optical members 121 to 126.

Figure 4:
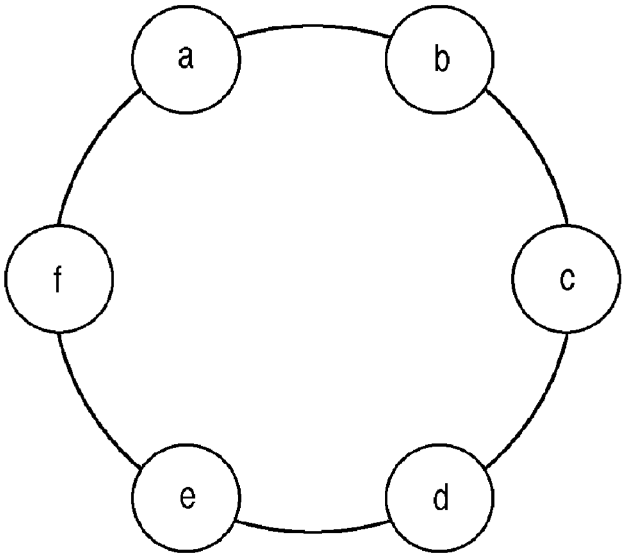
FIG. 4 is a view for explaining necklace permutation.

For the optical members 121 to 126, orientation patterns each including the angle (relative angle) around the optical axis and the relationship between the optical axis direction and the crystal axis are determined by necklace permutation. In other words, the orientation patterns of the optical members 121 to 126 can produce equivalent effects for the arrangements of necklace permutation. The necklace permutation herein means, when six elements a, b, c, d, e, and f are arranged in a circle in the order named as shown in FIG. 4, the order in which they are listed clockwise and that in which they are listed counterclockwise assuming one of them as the start point. For example, consider a case in which the orientation pattern of the optical member 121 is P1, the orientation pattern of the optical member 122 is P2, the orientation pattern of the optical member 123 is P3, the orientation pattern of the optical member 124 is P4, the orientation pattern of the optical member 125 is P5, and the orientation pattern of the optical member 126 is P6. FIG. 5 shows the arrangements of the necklace permutation of the orientation patterns P1 to P6 for the optical members 121 to 126 in this case. In FIG. 5, the first row describes the optical members 121 to 126, and the second to 13th rows describe the orientation patterns of the optical members 121 to 126.

Figure 6:
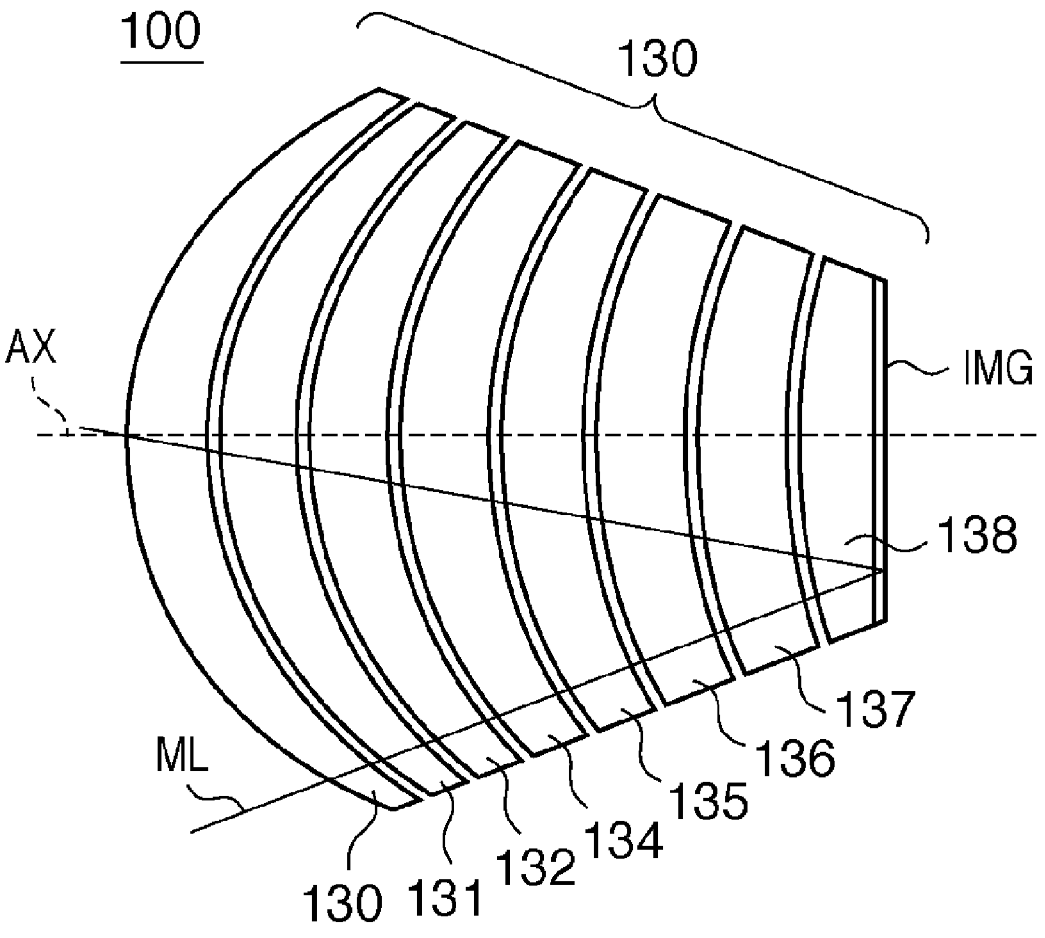
FIG. 6 is a schematic sectional view showing still another example of the arrangement of the projection optical system shown in FIG. 1.

Still another example of the arrangement of the projection optical system 100 will be explained next with reference to FIG. 6. FIG. 6 is a schematic sectional view showing still another example of the arrangement of the projection optical system 100. FIG. 6 shows optical members (lenses) of the projection optical system 100 near the second object plane IMG.

The projection optical system 100 includes at least eight optical members arrayed in turn from the second object plane IMG, as shown in FIG. 6. In this embodiment, the projection optical system 100 includes an optical member (first optical member) 131, optical member (second optical member) 132, optical member (third optical member) 133, optical member (fourth optical member) 134, optical member (fifth optical member) 135, optical member (sixth optical member) 136, optical member (seventh optical member) 137, and optical member (eighth optical member) 138 in turn from the first object plane OBJ. The projection optical system 100 is an immersion projection optical system in which the space between the optical member 138 and the second object plane IMG is filled with a liquid having a high refractive index.

The optical members 131 to 138 are made of an isotropic crystal (e.g., LuAG) having a high refractive index, and form a final lens (lens group) 130. The <1 1 1> crystal axes of four of the optical members 131 to 138 are oriented along the optical axis AX, while the <1 0 0> crystal axes of the remaining four of them are oriented along the optical axis AX. Alternately arraying optical members in each of which the <1 1 1> crystal axis is oriented along the optical axis AX, and those in each of which the <1 0 0> crystal axis is oriented along the optical axis AX makes it possible to cancel birefringences generated in these optical members.

In the projection optical system 100 shown in FIG. 6, two of the four members in each of which the <1 1 1> crystal axis is oriented along the optical axis are assembled at a relative angle α, while the remaining two of them are assembled at a relative angle β different from the relative angle α. Two of the four members in each of which the <1 0 0> crystal axis is oriented along the optical axis is oriented along the optical axis are assembled at a relative angle γ, while the remaining two of them are assembled at a relative angle δ different from the relative angle γ. In other words, since each set of two of the eight optical members 131 to 138 is assembled along the same orientation pattern, the optical members 131 to 138 are assembled with four orientation patterns as a whole. The optical members 131 and 137 are assembled along the same orientation pattern, the optical members 132 and 136 are assembled along the same orientation pattern, the optical members 133 and 135 are assembled along the same orientation pattern, and the optical members 134 and 138 are assembled along the same orientation pattern.

The angles (relative angles) of the optical members 131 to 138 around the optical axis in the projection optical system 100 shown in FIG. 6 satisfy:

$$\Phi1=\Phi7+m\times\eta\pm5°$$

$$\Phi2=\Phi6+n\times\eta\pm5°$$

$$\Phi3=\Phi5+o\times\eta\pm5°$$

$$\Phi4=\Phi8+p\times\eta\pm5° \quad (7)$$

or $$\Phi1=\Phi5+m\times\eta\pm5°$$

$$\Phi2=\Phi8+n\times\eta\pm5°$$

$$\Phi3=\Phi7+o\times\eta\pm5°$$

$$\Phi4=\Phi6+p\times\eta\pm5° \quad (8)$$

where Φ1 is the angle (relative angle) of the optical member 131 around the optical axis, Φ2 is the angle (relative angle) of the optical member 132 around the optical axis, Φ3 is the angle (relative angle) of the optical member 133 around the optical axis, Φ4 is the angle (relative angle) of the optical member 134 around the optical axis, Φ5 is the angle (relative angle) of the optical member 135 around the optical axis, Φ6 is the angle (relative angle) of the optical member 136 around the optical axis, Φ7 is the angle (relative angle) of the optical member 137 around the optical axis, Φ8 is the angle (relative angle) of the optical member 138 around the optical axis, and m, n, o, and p are integers. Note that η is 120° for optical members in each of which the <1 1 1> crystal axis is oriented along the optical axis AX, and η is 90° for optical members in each of which the <1 0 0> crystal axis is oriented along the optical axis AX.

When the projection optical system 100 shown in FIG. 6 satisfies the above-described condition with regard to the optical members 131 to 138, it can cancel crystal-structure-related birefringences more than 20 nm/cm even if they are contained in the optical members 131 to 138. In other words, the projection optical system 100 can reduce crystal-structure-related birefringences generated in the eight optical members 131 to 138.

The curvature radii of the surfaces of the optical members 131 to 138 on the first object plane side in the projection optical system 100 shown in FIG. 6 preferably satisfy:

$$R1<R2<R3<R4<R5<R6<R7<R8 \quad (9)$$

where R1 is the curvature radius of the surface of the optical member 131 on the first object plane side, R2 is the curvature radius of the surface of the optical member 132 on the first object plane side, R3 is the curvature radius of the surface of the optical member 133 on the first object plane side, R4 is the curvature radius of the surface of the optical member 134 on the first object plane side, R5 is the curvature radius of the surface of the optical member 135 on the first object plane side, R6 is the curvature radius of the surface of the optical member 136 on the first object plane side, R7 is the curvature radius of the surface of the optical member 137 on the first object plane side, and R8 is the curvature radius of the surface of the optical member 138 on the first object plane side.

In this case, it is possible to reduce crystal-structure-related birefringences generated in the eight optical members 131 to 138.

The maximum angles between the optical axis AX and a light beam ML in the optical members 131 to 138 of the projection optical system 100 shown in FIG. 6 preferably satisfy:

$$|\theta i-\theta j|<5° \ (i, j=1, 2, 3, 4, 5, 6, 7, 8) \quad (10)$$

where θ1 is the maximum angle between the optical axis AX and the light beam ML in the optical member 131, θ2 is the maximum angle between the optical axis AX and the light beam ML in the optical member 132, θ3 is the maximum angle between the optical axis AX and the light beam ML in the optical member 133, θ4 is the maximum angle between the optical axis AX and the light beam ML in the optical member 134, θ5 is the maximum angle between the optical axis AX and the light beam ML in the optical member 135, θ6 is the maximum angle between the optical axis AX and the light beam ML in the optical member 136, θ7 is the maximum angle between the optical axis AX and the light beam ML in the optical member 137, and θ8 is the maximum angle between the optical axis AX and the light beam ML in the optical member 138.

In this case, it is possible to reduce crystal-structure-related birefringences generated in the eight optical members 131 to 138.

For the optical members 131 to 138, orientation patterns each including the angle (relative angle) around the optical axis and the relationship between the optical axis direction and the crystal axis are determined by necklace permutation. In other words, the orientation patterns of the optical members 131 to 138 can produce equivalent effects for the arrangements of necklace permutation. For example, assume that the orientation pattern of the optical member 131 is Q1, the orientation pattern of the optical member 132 is Q2, the orientation pattern of the optical member 133 is Q3, the orientation pattern of the optical member 134 is Q4, the orientation pattern of the optical member 135 is Q5, the orientation pattern of the optical member 136 is Q6, the orientation pattern of the optical member 137 is Q7, and the orientation pattern of the optical member 138 is Q8. FIG. 7 shows the arrangements of the necklace permutation of the orientation patterns Q1 to Q8 for the optical members 131 to 138 in this case. In FIG. 7, the first row describes the optical members 131 to 138, and the second to 17th rows describe the orientation patterns of the optical members 131 to 138.

The projection optical system 100 according to the present invention will be explained in detail below.

First Embodiment

Figure 8:
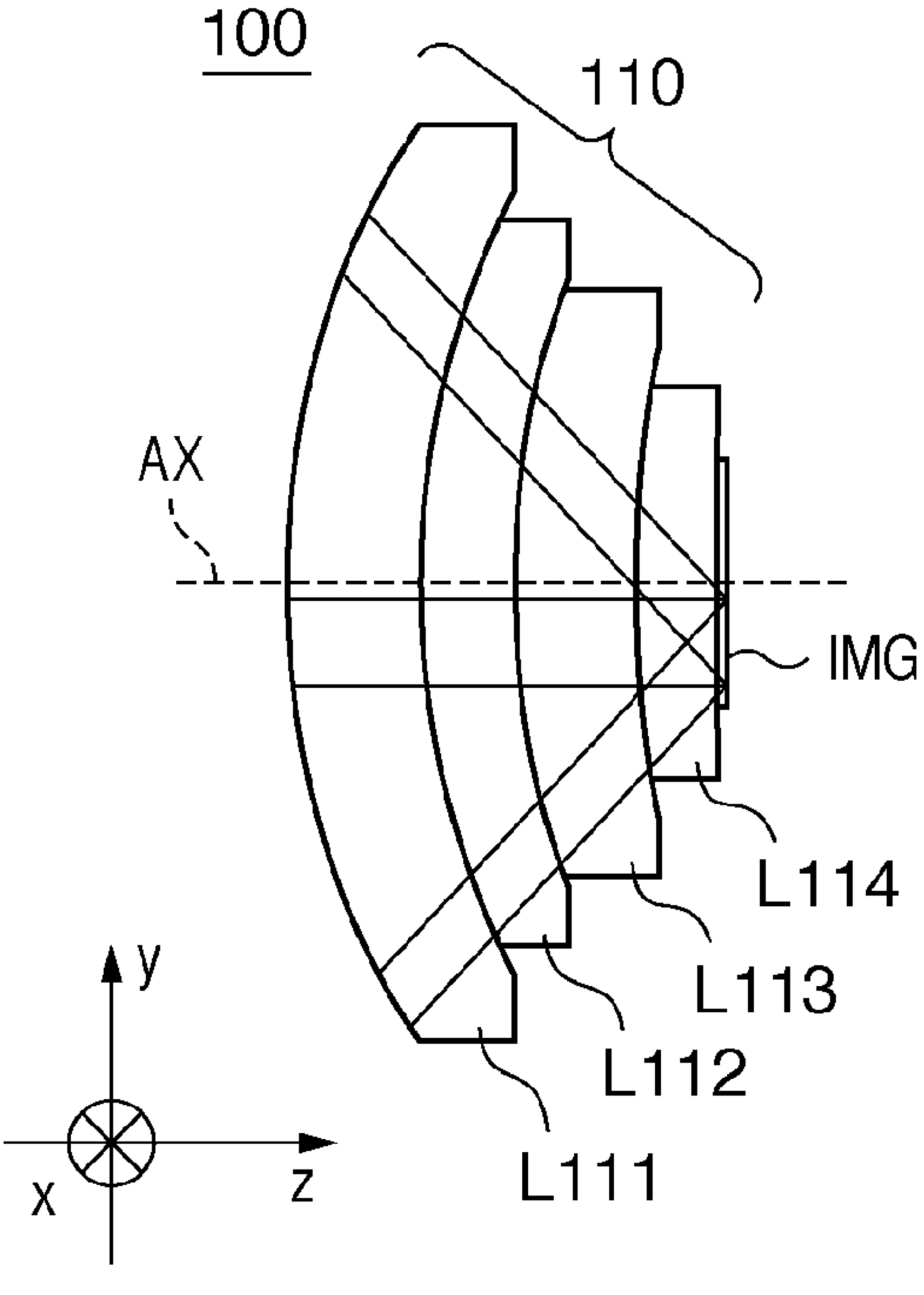
FIG. 8 is a schematic sectional view showing the arrangement of a projection optical system according to the first embodiment of the present invention.

FIG. 8 is a schematic sectional view showing the arrangement of a projection optical system 100 according to the first embodiment. FIG. 8 shows lenses of the projection optical system 100 near a second object plane IMG. The projection optical system 100 according to the first embodiment has a numerical aperture (NA) of 1.55. In addition, the projection optical system 100 according to the first embodiment adopts the arrangement of the projection optical system 100 shown in FIG. 2, and is a catadioptric projection optical system including a plurality of lenses and at least one reflecting member.

The projection optical system 100 according to the first embodiment includes lenses L114, L113, L112, and L111 in turn from the second object plane IMG. The lenses L111 to L114 are made of LuAG having a refractive index of 2.14 with respect to light having a wavelength of 193 nm, and form a final lens (lens group) 110. Other lenses (not shown) of the projection optical system 100 according to the first embodiment are made of quartz.

The projection optical system 100 according to the first embodiment can use image heights from 12.5 mm to 66.0 mm, and ensures an effective slit region of 26×7 mm. FIG. 9 shows a numerical specification table of the projection optical system 100 according to the first embodiment. In FIG. 9, the first column describes the lenses L111 to L114, the second column describes the curvature radii (mm) of the surfaces of the lenses L111 to L114, the third column describes the on-axis intervals (mm) of the lens surfaces, the fourth column describes the lens materials, and the fifth column describes the lens orientation patterns.

The space between the lens L114 and the second object plane IMG in the projection optical system 100 according to the first embodiment is filled with a liquid having a refractive index of 1.80.

The <1 1 1> crystal axis of the lens L111 is oriented along an optical axis AX (optical axis direction), and an image of the <1 0 0> crystal axis of the lens L111, which is projected onto a plane perpendicular to the optical axis, is oriented along the y-axis direction. This orientation pattern will be referred to as <1 1 1-0°> hereinafter (see FIG. 9). In FIG. 8, a right-handed coordinate system is defined assuming a direction perpendicular to the paper surface as the x-axis (the direction going into the paper surface is the plus direction).

The <1 0 0> crystal axis of the lens L112 is oriented along the optical axis AX (optical axis direction), and an image of the <0 0 1> crystal axis of the lens L112, which is projected onto a plane perpendicular to the optical axis, is oriented along the y-axis direction. This orientation pattern will be referred to as <1 0 0-0°> hereinafter (see FIG. 9).

The <1 1 1> crystal axis of the lens L113 is oriented along the optical axis AX (optical axis direction), and an image of the <1 0 0> crystal axis of the lens L113, which is projected onto a plane perpendicular to the optical axis, is oriented to have a relative angle (around the optical axis) of 60°±120°×n (n is an integer) with respect to the y-axis direction. This orientation pattern will be referred to as <1 1 1-60°> hereinafter (see FIG. 9).

The <1 0 0> crystal axis of the lens L114 is oriented along the optical axis AX (optical axis direction), and an image of the <0 0 1> crystal axis of the lens L114, which is projected onto a plane perpendicular to the optical axis, is oriented to have a relative angle (around the optical axis) of 45°±90°×m (m is an integer) with respect to the y-axis direction. This orientation pattern will be referred to as <1 0 0-45°> hereinafter (see FIG. 9).

Curvature radii R1, R2, R3, and R4 of the surfaces of the lenses L111 to L114 on the first object plane side satisfy R1<R2<R3<R4 (relation (2)).

All the maximum angles between the optical axis AX and a light beam which propagates through the lenses L111 to L114 are 46.4°. Hence, maximum angles θ1 to θ4 in the lenses L111 to L114 satisfy $|\theta i-\theta j|<5°$ (i, j=1, 2, 3, 4) (relation (3)).

With the above-described arrangement, the projection optical system 100 according to the first embodiment can reduce crystal-structure-related birefringence generated in the final lens 110.

Figure 10A:
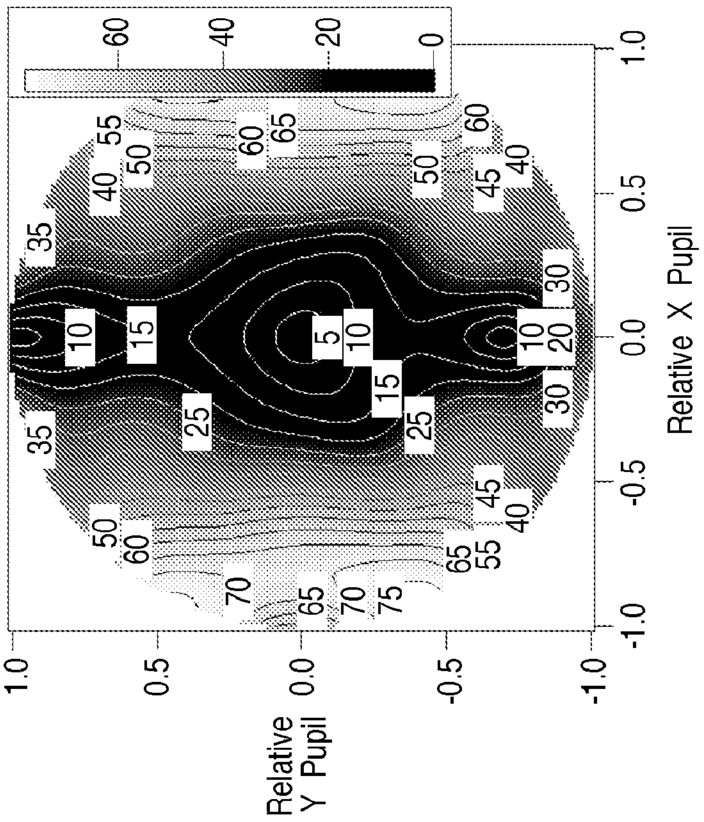
FIGS. 10A and 10B are graphs each showing a pupil retardance distribution attributed to crystal-structure-related birefringence in the projection optical system according to the first embodiment.
Figure 10B:
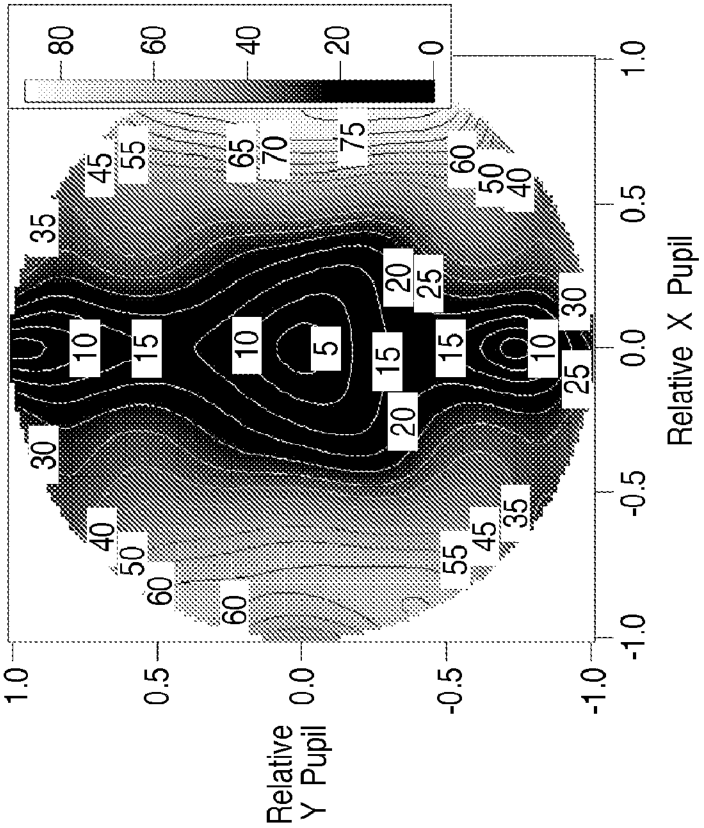

FIGS. 10A and 10B each show a pupil retardance distribution attributed to crystal-structure-related birefringence in the projection optical system 100 according to the first embodiment. FIG. 10A shows the pupil retardance distribution at an image height of Y=6.0 mm and X=0.0 mm (corresponding to the slit center) on the second object plane IMG shown in FIG. 8. FIG. 10B shows the pupil retardance distribution at an image height of Y=6.0 mm and X=13.0 mm (corresponding to the slit edge) on the second object plane IMG shown in FIG. 8. Referring to FIGS. 10A and 10B, the RMS value of retardance in the pupil is corrected to 41.8 mλ at the slit center and to 41.8 mλ at the slit edge.

Figure 11:
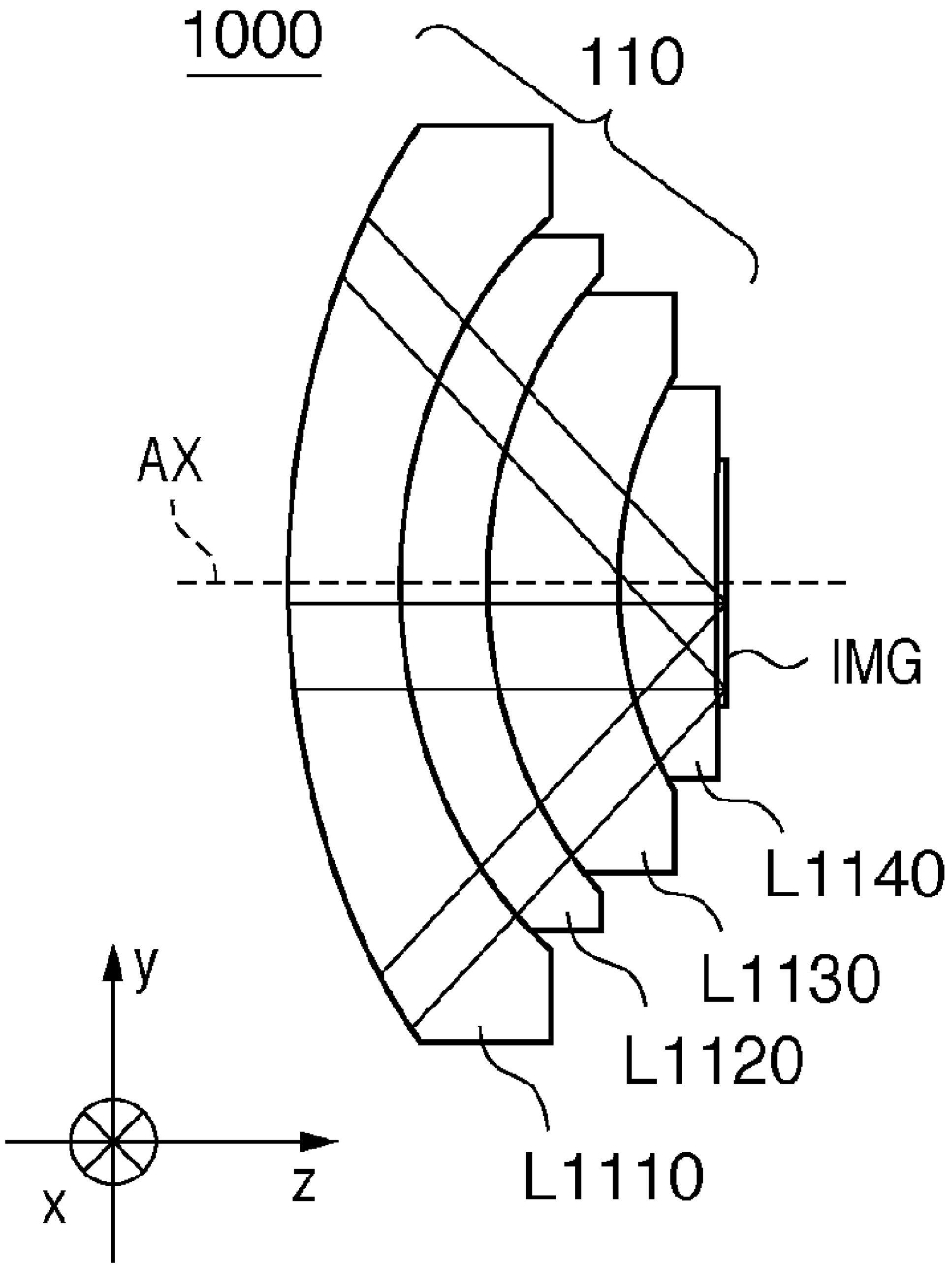
FIG. 11 is a schematic sectional view showing the arrangement of a projection optical system which does not satisfy relation (2).

For example, consider a projection optical system 1000 which does not satisfy relation (2), as shown in FIG. 11. FIG. 11 is a schematic sectional view showing the arrangement of the projection optical system 1000. FIG. 11 shows lenses L1110 to L1140 of the projection optical system 1000 near the second object plane IMG. FIG. 12 shows a numerical specification table of the projection optical system 1000.

The projection optical system 1000 has the same orientation patterns and the same maximum angles, between the optical axis AX and a light beam which propagates through the lenses L1110 to L1140, as those of the projection optical system 100 according to the first embodiment, but does not satisfy relation (2) alone.

Figure 13B:
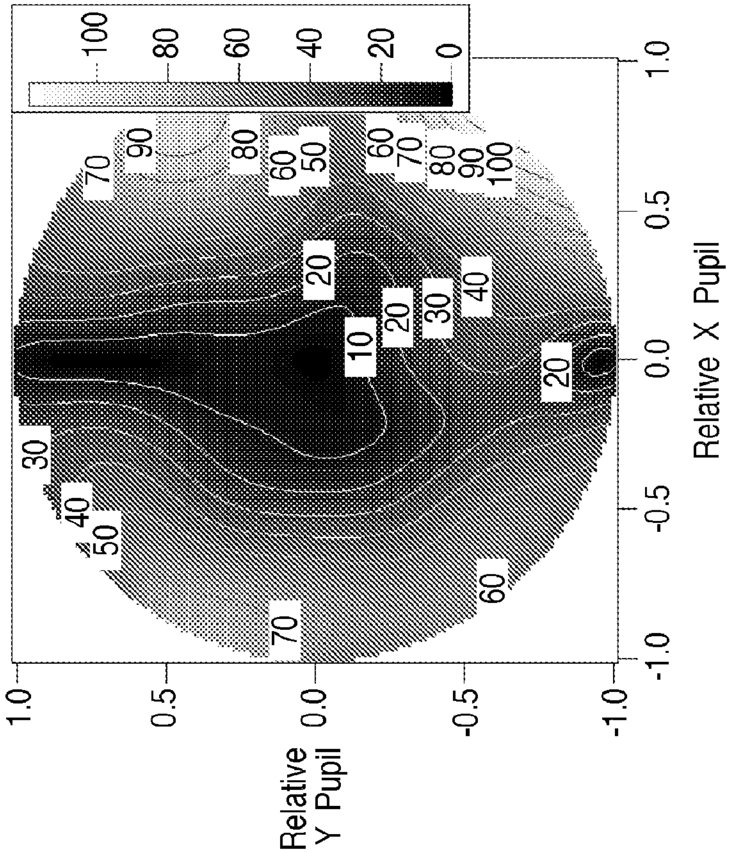
FIGS. 13A and 13B are graphs each showing a pupil retardance distribution attributed to crystal-structure-related birefringence in the projection optical system shown in FIG. 11.
Figure 13A:
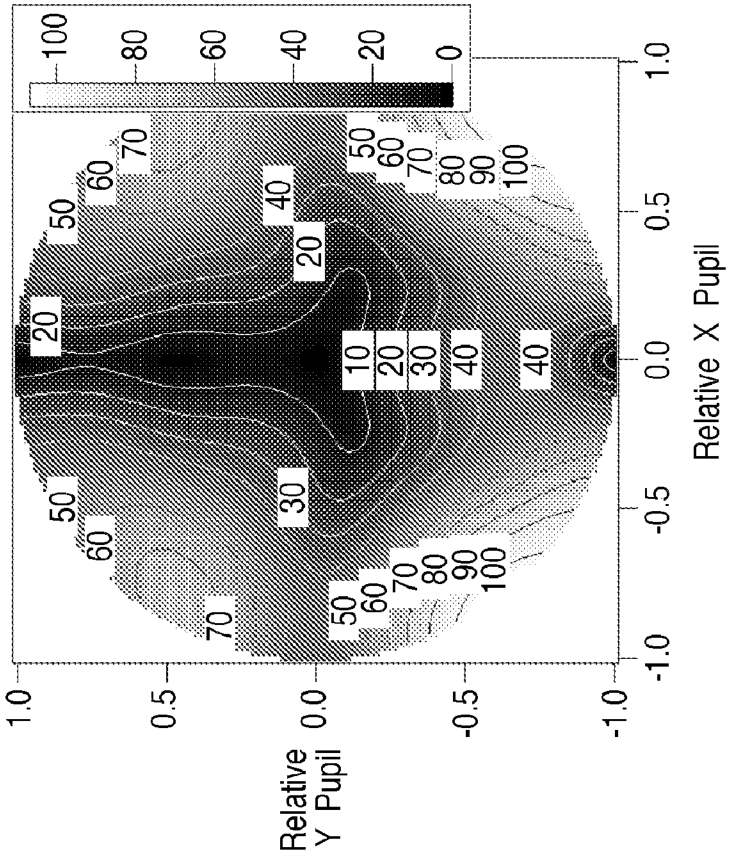

FIGS. 13A and 13B each show a pupil retardance distribution attributed to crystal-structure-related birefringence in the projection optical system 1000. FIG. 13A shows the pupil retardance distribution at an image height of Y=6.0 mm and X=0.0 mm (corresponding to the slit center) on the second object plane IMG shown in FIG. 11. FIG. 13B shows the pupil retardance distribution at an image height of Y=6.0 mm and X=13.0 mm (corresponding to the slit edge) on the second object plane IMG shown in FIG. 11. Referring to FIGS. 13A and 13B, the RMS value of retardance in the pupil is corrected to 50.9 mλ at the slit center and to 48.8 mλ at the slit edge. In view of this, satisfying relation (2) makes it possible to more effectively correct crystal-structure-related birefringence.

In this manner, the projection optical system 100 according to the first embodiment can attain an excellent imaging performance by reducing the adverse influence of crystal-structure-related birefringence. Two optical members of the final lens 110, in each of which the <1 1 1> crystal axis is oriented along the optical axis AX, and the remaining two optical members of the final lens 110, in each of which the <1 0 0> crystal axis is oriented along the optical axis AX, need only be alternately arrayed. Therefore, the present invention does not particularly limit whether an optical member in which the <1 0 0> crystal axis is oriented along the optical axis or that in which the <1 1 1> crystal axis is oriented along the optical axis is placed closest to the first object plane (or closest to the second object plane). Optimal assembly angles of the optical members are set as needed. The crystal axes, lens materials, curvatures, thicknesses, and the like of the optical members of the final lens 110 are also set as needed.

Second Embodiment

Figure 14:
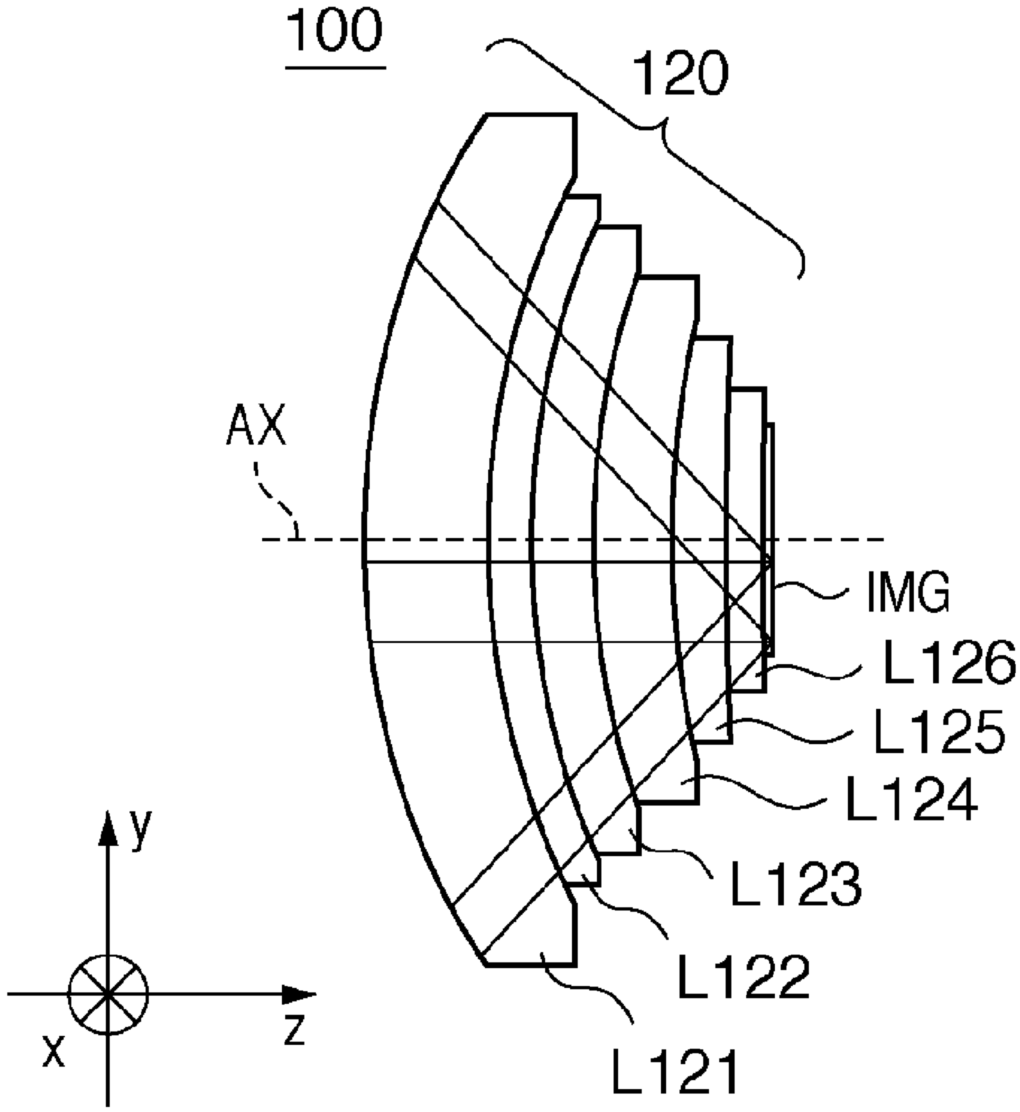
FIG. 14 is a schematic sectional view showing the arrangement of a projection optical system according to the second embodiment of the present invention.

FIG. 14 is a schematic sectional view showing the arrangement of a projection optical system 100 according to the second embodiment. FIG. 14 shows lenses of the projection optical system 100 near a second object plane IMG. The projection optical system 100 according to the second embodiment has a numerical aperture (NA) of 1.55. In addition, the projection optical system 100 according to the second embodiment adopts the arrangement of the projection optical system 100 shown in FIG. 3, and is a catadioptric projection optical system including a plurality of lenses and at least one reflecting member.

The projection optical system 100 according to the second embodiment includes lenses L126, L125, L124, L123, L122, and L121 in turn from the second object plane IMG. The lenses L121 to L126 are made of LuAG having a refractive index of 2.14 with respect to light having a wavelength of 193 nm, and form a final lens (lens group) 120. Other lenses (not shown) of the projection optical system 100 according to the second embodiment are made of quartz.

The projection optical system 100 according to the second embodiment can use image heights from 12.5 mm to 66.0 mm, and ensures an effective slit region of 26×7 mm. FIG. 15 shows a numerical specification table of the projection optical system 100 according to the second embodiment. In FIG. 15, the first column describes the lenses L121 to L126, the second column describes the curvature radii (mm) of the surfaces of the lenses L121 to L126, the third column describes the on-axis intervals (mm) of the lens surfaces, the fourth column describes the lens materials, and the fifth column describes the lens orientation patterns.

The space between the lens L126 and the second object plane IMG in the projection optical system 100 according to the second embodiment is filled with a liquid having a refractive index of 1.80.

As shown in FIG. 15, the lens L121 is oriented along the <1 1 1-0°> orientation pattern.

As shown in FIG. 15, the lens L122 is oriented along the <1 0 0-45°> orientation pattern.

As shown in FIG. 15, the lens L123 is oriented along the <1 1 1-60°> orientation pattern.

As shown in FIG. 15, the lens L124 is oriented along the <1 0 0-0°> orientation pattern.

As shown in FIG. 15, the lens L125 is oriented along the <1 1 1-60°> orientation pattern.

As shown in FIG. 15, the lens L126 is oriented along the <1 0 0-45°> orientation pattern.

Curvature radii R1, R2, R3, R4, R5, and R6 of the surfaces of the lenses L121 to L126 on the first object plane side satisfy $R1<R2<R3<R4<R5<R6$ (relation (5)).

All the maximum angles between an optical axis AX and a light beam which propagates through the lenses L121 to L126 are 46.4°. Hence, maximum angles $\theta 1$ to $\theta 6$ in the lenses L121 to L126 satisfy $|\theta i-\theta j|<5°$ (i, j=1, 2, 3, 4, 5, 6) (relation (6)).

With the above-described arrangement, the projection optical system 100 according to the second embodiment can reduce crystal-structure-related birefringence generated in the final lens 120.

Figure 16B:
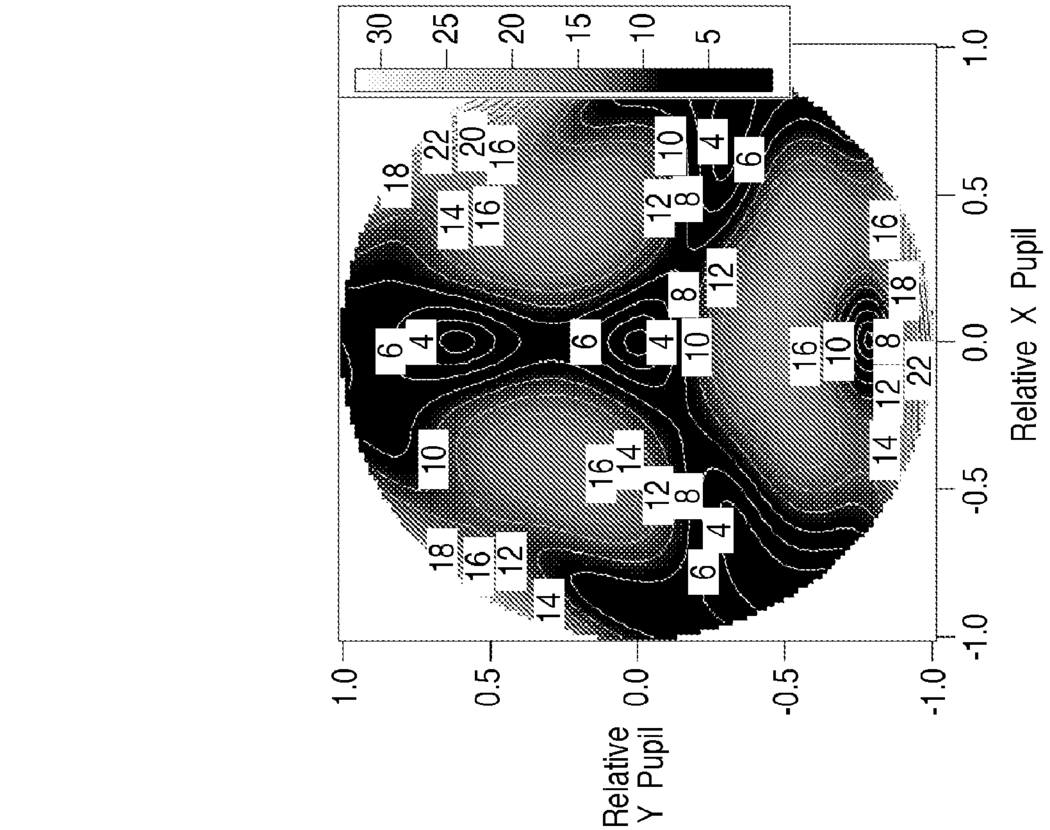
FIGS. 16A and 16B are graphs each showing a pupil retardance distribution attributed to crystal-structure-related birefringence in the projection optical system according to the second embodiment.
Figure 16A:
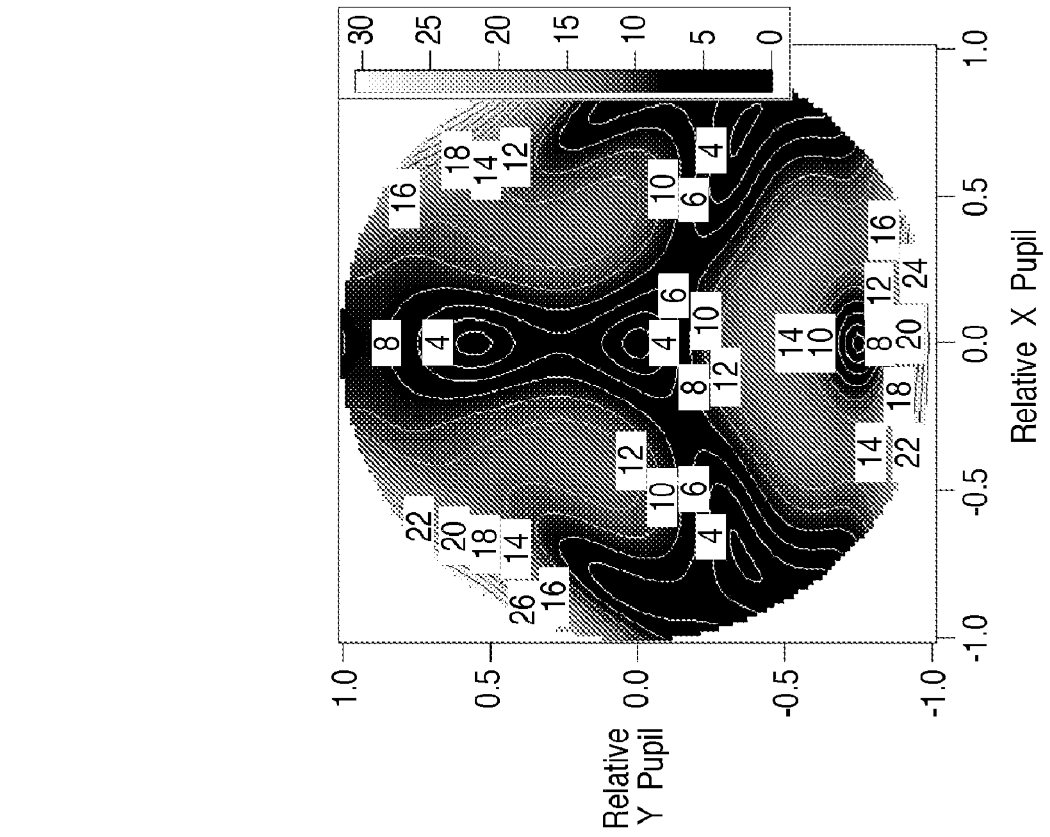

FIGS. 16A and 16B each show a pupil retardance distribution attributed to crystal-structure-related birefringence in the projection optical system 100 according to the second embodiment. FIG. 16A shows the pupil retardance distribution at an image height of Y=6.0 mm and X=0.0 mm (corresponding to the slit center) on the second object plane IMG shown in FIG. 14. FIG. 16B shows the pupil retardance distribution at an image height of Y=6.0 mm and X=13.0 mm (corresponding to the slit edge) on the second object plane IMG shown in FIG. 14. Referring to FIGS. 16A and 16B, the RMS value of retardance in the pupil is corrected to 11.7 mλ at the slit center and to 12.3 mλ at the slit edge.

In this manner, the projection optical system 100 according to the second embodiment can attain an excellent imaging performance by reducing the adverse influence of crystal-structure-related birefringence. Three optical members of the final lens 120, in each of which the <1 1 1> crystal axis is oriented along the optical axis AX, and the remaining three optical members of the final lens 120, in each of which the <1 0 0> crystal axis is oriented along the optical axis AX, need only be alternately arrayed. Therefore, the present invention does not particularly limit whether an optical member in which the <1 0 0> crystal axis is oriented along the optical axis or that in which the <1 1 1> crystal axis is oriented along the optical axis is placed closest to the first object plane (or closest to the second object plane). The assembly angles of the optical members are also not particularly limited, and the same effect as in the second embodiment can be obtained as long as they have the arrangement shown in relation (4) and FIG. 5. The crystal axes, lens materials, curvatures, thicknesses, and the like of the optical members of the final lens 120 are also set as needed.

Third Embodiment

Figure 17:
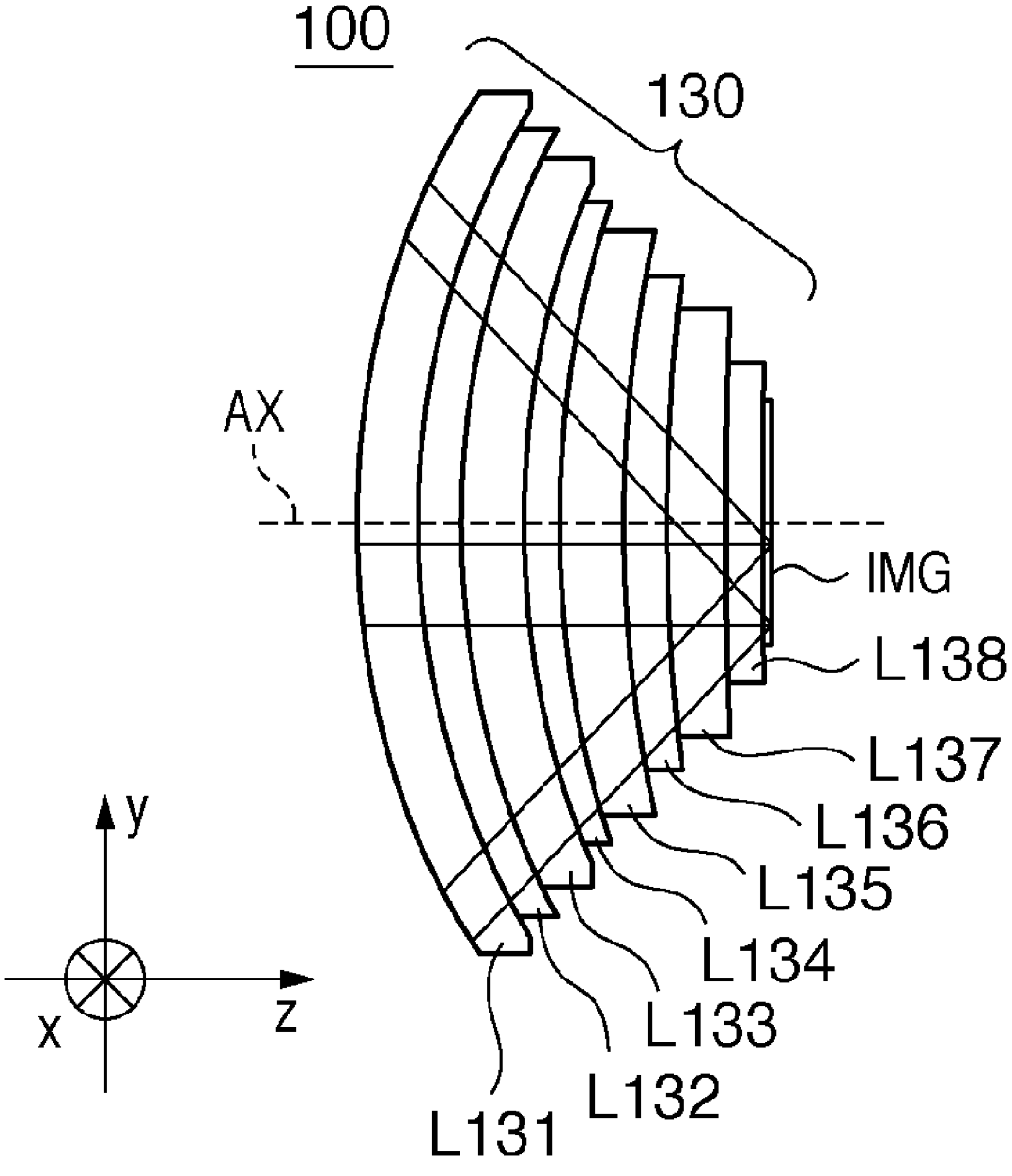
FIG. 17 is a schematic sectional view showing the arrangement of a projection optical system according to the third embodiment of the present invention.

FIG. 17 is a schematic sectional view showing the arrangement of a projection optical system 100 according to the third embodiment. FIG. 17 shows lenses of the projection optical system 100 near a second object plane IMG. The projection optical system 100 according to the third embodiment has a numerical aperture (NA) of 1.55. In addition, the projection optical system 100 according to the third embodiment adopts the arrangement of the projection optical system 100 shown in FIG. 6, and is a catadioptric projection optical system including a plurality of lenses and at least one reflecting member.

The projection optical system 100 according to the third embodiment includes lenses L138, L137, L136, L135, L134, L133, L132, and L131 in turn from the second object plane IMG. The lenses L131 to L138 are made of LuAG having a refractive index of 2.14 with respect to light having a wavelength of 193 nm, and form a final lens (lens group) 130. Other lenses (not shown) of the projection optical system 100 according to the third embodiment are made of quartz.

The projection optical system 100 according to the third embodiment can use image heights from 12.5 mm to 66.0 mm, and ensures an effective slit region of 26×7 mm. FIG. 18 shows a numerical specification table of the projection optical system 100 according to the third embodiment. In FIG. 18, the first column describes the lenses L131 to L138, the second column describes the curvature radii (mm) of the surfaces of the lenses L131 to L138, the third column describes the on-axis intervals (mm) of the lens surfaces, the fourth column describes the lens materials, and the fifth column describes the lens orientation patterns.

The space between the lens L138 and the second object plane IMG in the projection optical system 100 according to the third embodiment is filled with a liquid having a refractive index of 1.80.

As shown in FIG. 18, the lens L131 is oriented along the <1 1 1-0°> orientation pattern.

As shown in FIG. 18, the lens L132 is oriented along the <1 0 0-45°> orientation pattern.

As shown in FIG. 18, the lens L133 is oriented along the <1 1 1-60°> orientation pattern.

As shown in FIG. 18, the lens L134 is oriented along the <1 0 0-0°> orientation pattern.

As shown in FIG. 18, the lens L135 is oriented along the <1 1 1-60°> orientation pattern.

As shown in FIG. 18, the lens L136 is oriented along the <1 0 0-45°> orientation pattern.

As shown in FIG. 18, the lens L137 is oriented along the <1 1 1-0°> orientation pattern.

As shown in FIG. 18, the lens L138 is oriented along the <1 0 0-0°> orientation pattern.

Curvature radii R1, R2, R3, R4, R5, R6, R7, and R8 of the surfaces of the lenses L131 to L138 on the first object plane side satisfy $R1<R2<R3<R4<R5<R6<R7<R8$ (relation (9)).

All the maximum angles between an optical axis AX and a light beam which propagates through the lenses L131 to L138 are 46.4°. Hence, maximum angles θ1 to θ8 in the lenses L131 to L138 satisfy $|\theta i-\theta j|<5^\circ$ (i, j=1, 2, 3, 4, 5, 6, 7, 8) (relation (10)).

With the above-described arrangement, the projection optical system 100 according to the third embodiment can reduce crystal-structure-related birefringence generated in the final lens 110.

Figure 19A:
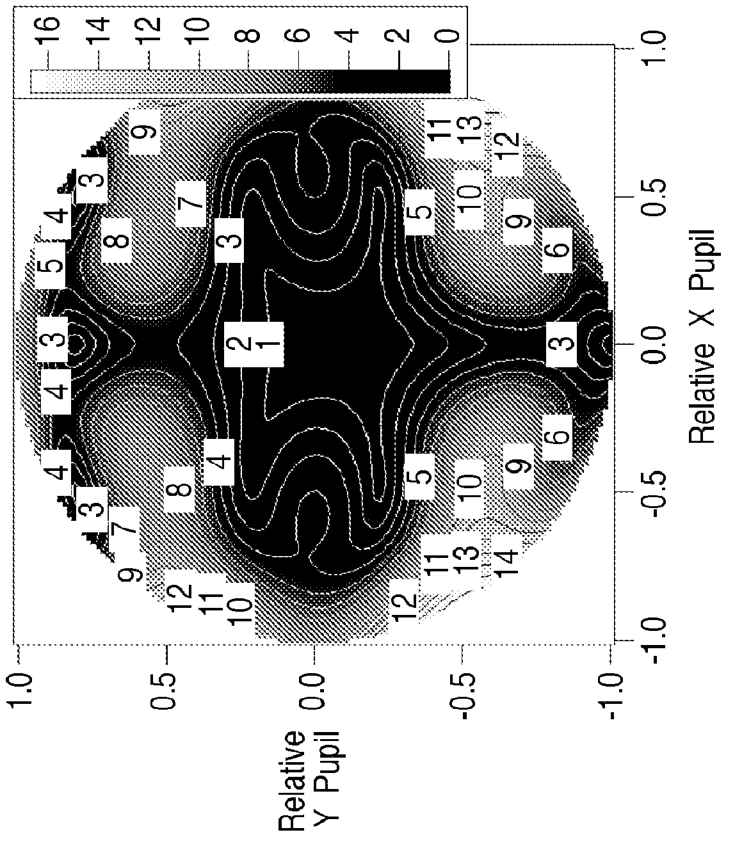
FIGS. 19A and 19B are graphs each showing a pupil retardance distribution attributed to crystal-structure-related birefringence in the projection optical system according to the third embodiment.
Figure 19B:
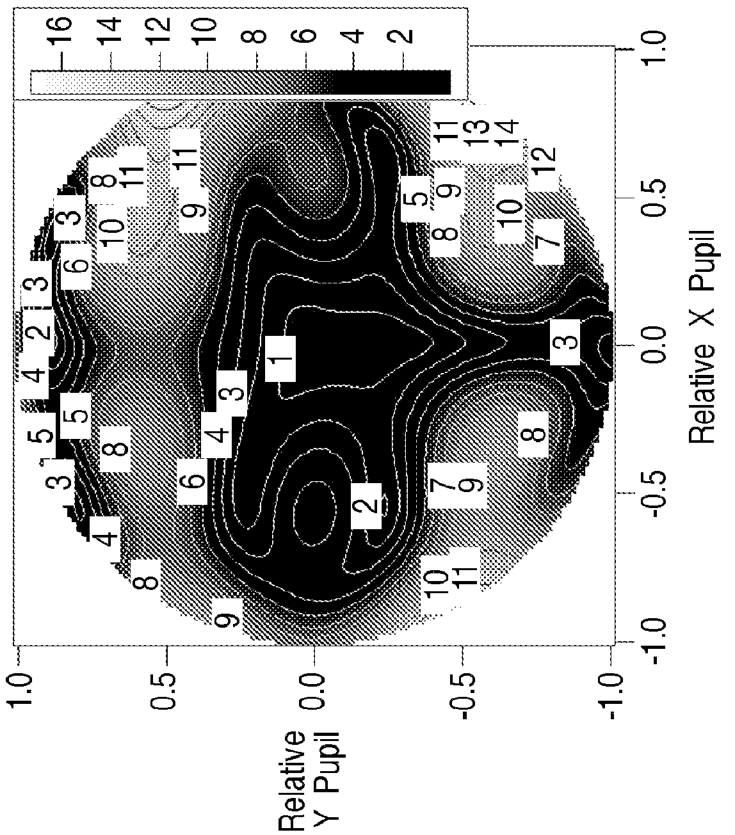

FIGS. 19A and 19B each show a pupil retardance distribution attributed to crystal-structure-related birefringence in the projection optical system 100 according to the third embodiment. FIG. 19A shows the pupil retardance distribution at an image height of Y=6.0 mm and X=0.0 mm (corresponding to the slit center) on the second object plane IMG shown in FIG. 17. FIG. 19B shows the pupil retardance distribution at an image height of Y=6.0 mm and X=13.0 mm (corresponding to the slit edge) on the second object plane IMG shown in FIG. 17. Referring to FIGS. 19A and 19B, the RMS value of retardance in the pupil is corrected to 6.6 mλ at the slit center and to 6.6 mλ at the slit edge.

In this manner, the projection optical system 100 according to the third embodiment can attain an excellent imaging performance by reducing the adverse influence of crystal-structure-related birefringence. Four optical members of the final lens 130, in each of which the <1 1 1> crystal axis is oriented along the optical axis AX, and the remaining four optical members of the final lens 130, in each of which the <1 0 0> crystal axis is oriented along the optical axis AX, need only be alternately arrayed. Therefore, the present invention does not particularly limit whether an optical member in which the <1 0 0> crystal axis is oriented along the optical axis or that in which the <1 1 1> crystal axis is oriented along the optical axis is placed closest to the first object plane (or closest to the second object plane). The assembly angles of the optical members are also not particularly limited, and the same effect as in the third embodiment can be obtained as long as they have the arrangement shown in relation (7) or (8) and FIG. 9. The crystal axes, lens materials, curvatures, thicknesses, and the like of the optical members of the final lens 130 are also set as needed.

Figure 20:
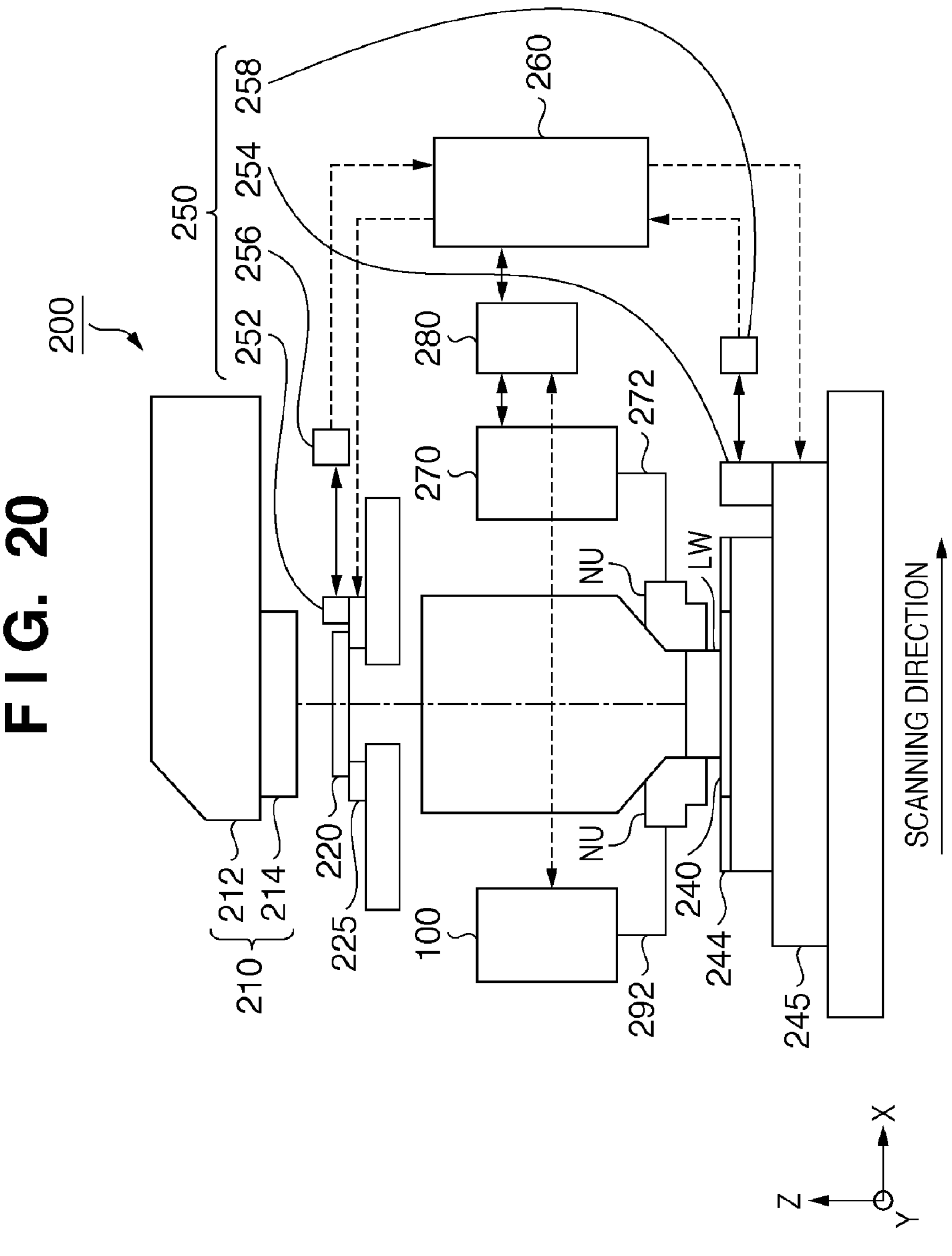
FIG. 20 is a schematic sectional view showing the arrangement of an exposure apparatus according to one aspect of the present invention.

An exposure apparatus 200 to which a projection optical system 100 according to the present invention is applied will be explained below with reference to FIG. 20. FIG. 20 is a schematic sectional view showing the arrangement of the exposure apparatus 200 according to one aspect of the present invention.

The exposure apparatus 200 is an immersion exposure apparatus which transfers the pattern of a reticle 220 onto a wafer 240 by the step & scan scheme via a liquid LW supplied between the projection optical system 100 and the wafer 240. However, the projection optical system 100 is also applicable to exposure apparatuses other than an immersion exposure apparatus.

As shown in FIG. 20, the exposure apparatus 200 includes an illumination apparatus 210, a reticle stage 225 for mounting the reticle 220, the projection optical system 100, a wafer stage 245 for mounting the wafer 240, a distance measurement apparatus 250, a stage controller 260, a liquid supply unit 270, an immersion controller 280, a liquid recovery unit 290, and a nozzle unit NU.

The illumination apparatus 210 includes a light source unit 212 and illumination optical system 214. In this embodiment, an ArF excimer laser having a wavelength of 193 nm is used as the light source of the light source unit 212.

The illumination optical system 214 illuminates the reticle 220 with light from the light source unit 212.

The reticle 220 is transported from the outside of the exposure apparatus 200 by a reticle transport system (not shown), and is supported and driven by the reticle stage 225.

The reticle stage 225 supports the reticle 220 via a reticle chuck (not shown), and is controlled by the stage controller 260.

The projection optical system 100 projects a pattern image on the reticle 220 serving as a first object plane onto the wafer 240 serving as a second object plane. The projection optical system 100 can take any of the above-described forms, and a detailed description thereof will not be given herein.

The wafer 240 is a substrate onto which the pattern of the reticle 220 is projected (transferred). However, the wafer 240 can be substituted by a glass plate or another substrate. The wafer 240 is coated with a photoresist.

A liquid holding unit 244 is arranged around the wafer 240 supported by the wafer stage 245. The liquid holding unit 244 is a plate having a surface flush with the surface of the wafer 240. In exposing a shot region near the periphery of the wafer 240, the liquid holding unit 244 holds the liquid LW in the outer region of the wafer 240.

The distance measurement apparatus 250 measures the positions of the reticle stage 225 and wafer stage 245 in real time using reference mirrors 252 and 254 and laser interferometers 256 and 258. The distance measurement result obtained by the distance measurement apparatus 250 is sent to the stage controller 260.

Based on the distance measurement result obtained by the distance measurement apparatus 250, the stage controller 260 controls the driving of the reticle stage 225 and wafer stage 245 to perform their alignment and synchronous control.

The liquid supply unit 270 supplies the liquid LW to the space or gap between the wafer 240 and the final lens of the projection optical system 100. The liquid supply unit 270 includes a liquid supply pipe 272. The liquid supply unit 270 supplies the liquid LW to that space via the liquid supply pipe 272 arranged around the final lens of the projection optical system 100. With this operation, a film of the liquid LW is formed in the space between the projection optical system 100 and the wafer 240.

The immersion controller 280 acquires pieces of information such as the current position, velocity, and acceleration of the wafer stage 245 from the stage controller 260, and performs immersion exposure control based on these pieces of information.

The liquid recovery unit 290 has a function of recovering the liquid LW supplied between the projection optical system 100 and the wafer 240 by the liquid supply unit 270, and includes a liquid recovery pipe 292. The liquid recovery pipe 292 recovers the liquid LW, which is supplied between the projection optical system 100 and the wafer 240 by the liquid supply unit 270, via a liquid recovery port formed in the nozzle unit NU.

A liquid supply port and liquid recovery port are formed in the nozzle unit NU on the side of the wafer 240. The liquid supply port serves to supply the liquid LW, and is connected to the liquid supply pipe 272. The liquid recovery port serves to recover the supplied liquid LW, and is connected to the liquid recovery pipe 292.

In exposure, a light beam emitted by the light source unit 212 illuminates the reticle 220 by the illumination optical system 214. The pattern of the reticle 220 is imaged on the wafer 240 via the liquid LW by the projection optical system 100. The projection optical system 100 used for the exposure apparatus 200 has an excellent imaging performance and hence can provide devices (e.g., a semiconductor device, an LCD device, an image sensing device (e.g., a CCD), and a thin-film magnetic head) with high throughput and a good economical efficiency. These devices are fabricated by a step of exposing a substrate (e.g., a wafer or glass plate) coated with a photoresist (photosensitive agent) using the exposure apparatus 200, a step of developing the exposed substrate, and other known steps.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2007-196588 filed on Jul. 27, 2007, which is hereby incorporated by reference herein in its entirety.

What is claimed is:

1. A projection optical system which projects an image on a first object plane onto a second object plane, comprising at least four optical members which are arrayed in turn from the second object plane, and made of an isotropic crystal, wherein said at least four optical members are formed by alternately arraying optical members in each of which a <1 1 1> crystal axis is oriented along a direction of an optical axis, and optical members in each of which a <1 0 0> crystal axis is oriented along the direction of the optical axis, when said at least four optical members are determined as a first optical member, a second optical member, a third optical member, and a fourth optical member in turn from the first object plane, maximum angles θ1, θ2, θ3, and θ4 between the optical axis and a light beam which propagates through said first optical member, said second optical member, said third optical member, and said fourth optical member satisfy:

$$|\theta i-\theta j|<5°(i, j=1, 2, 3, 4)$$

and a curvature radius R1 of a surface of said first optical member on a side of the first object plane, a curvature radius R2 of a surface of said second optical member on the side of the first object plane, a curvature radius R3 of a surface of said third optical member on the side of the first object plane, and a curvature radius R4 of a surface of said fourth optical member on the side of the first object plane satisfy:

$$R1<R2<R3<R4.$$

2. A projection optical system which projects an image on a first object plane onto a second object plane, comprising at least six optical members which are arrayed in turn from the second object plane, and made of an isotropic crystal, wherein said at least six optical members are formed by alternately arraying optical members in each of which a <1 1 1> crystal axis is oriented along a direction of an optical axis, and optical members in each of which a <1 0 0> crystal axis is oriented along the direction of the optical axis, and when said at least six optical members are determined as a first optical member, a second optical member, a third optical member, a fourth optical member, a fifth optical member, and a sixth optical member in turn from the first object plane, angles Φ2, Φ3, Φ5, and Φ6 of said second optical member, said third optical member, said fifth optical member, and said sixth optical member around the optical axis satisfy:

$$\Phi 2=\Phi 6+m\times\eta\pm 5^\circ$$

$$\Phi 3=\Phi 5+n\times\eta\pm 5^\circ$$

where m and n are integers, and η is 120° if the <1 1 1> crystal axis is oriented along the direction of the optical axis, and η is 90° if the <1 0 0> crystal axis is oriented along the direction of the optical axis.

3. The system according to claim 2, wherein for said first optical member, said second optical member, said third optical member, said fourth optical member, said fifth optical member, and said sixth optical member, orientation patterns each including the angle around the optical axis and a relationship between the direction of the optical axis and the crystal axis are determined by necklace permutation.

4. The system according to claim 2, wherein a curvature radius R1 of a surface of said first optical member on a side of the first object plane, a curvature radius R2 of a surface of said second optical member on the side of the first object plane, a curvature radius R3 of a surface of said third optical member on the side of the first object plane, a curvature radius R4 of a surface of said fourth optical member on the side of the first object plane, a curvature radius R5 of a surface of said fifth optical member on the side of the first object plane, and a curvature radius R6 of a surface of said sixth optical member on the side of the first object plane satisfy:

$$R1<R2<R3<R4<R5<R6.$$

5. The system according to claim 2, wherein maximum angles θ1, θ2, θ3, θ4, θ5, and θ6 between the optical axis and a light beam which propagates through said first optical member, said second optical member, said third optical member, said fourth optical member, said fifth optical member, and said sixth optical member satisfy:

$$|\theta i-\theta j|<5^\circ (i, j=1, 2, 3, 4, 5, 6).$$

6. A projection optical system which projects an image on a first object plane onto a second object plane, comprising at least eight optical members which are arrayed in turn from the second object plane, and made of an isotropic crystal, wherein said at least eight optical members are formed by alternately arraying optical members in each of which a <1 1 1> crystal axis is oriented along a direction of an optical axis, and optical members in each of which a <1 0 0> crystal axis is oriented along the direction of the optical axis, and when said at least eight optical members are determined as a first optical member, a second optical member, a third optical member, a fourth optical member, a fifth optical member, a sixth optical member, a seventh optical member, and an eighth optical member in turn from the first object plane, angles Φ1, Φ2, Φ3, Φ4, Φ5, Φ6, Φ7, and Φ8 of said first optical member, said second optical member, said third optical member, said fourth optical member, said fifth optical member, said sixth optical member, said seventh optical member, and said eighth optical member around the optical axis satisfy:

$$\Phi 1=\Phi 7+m\times\eta\pm 5^\circ$$

$$\Phi 2=\Phi 6+n\times\eta\pm 5^\circ$$

$$\Phi 3=\Phi 5+o\times\eta\pm 5^\circ$$

$$\Phi 4=\Phi 8+p\times\eta\pm 5^\circ$$

where m, n, o, and p are integers, and η is 120° if the <1 1 1> crystal axis is oriented along the direction of the optical axis, and η is 90° if the <1 0 0> crystal axis is oriented along the direction of the optical axis.

7. The system according to claim 6, wherein for said first optical member, said second optical member, said third optical member, said fourth optical member, said fifth optical member, said sixth optical member, said seventh optical member, and said eighth optical member, orientation patterns each including the angle around the optical axis and a relationship between the direction of the optical axis and the crystal axis are determined by necklace permutation.

8. The system according to claim 6, wherein a curvature radius R1 of a surface of said first optical member on a side of the first object plane, a curvature radius R2 of a surface of said second optical member on the side of the first object plane, a curvature radius R3 of a surface of said third optical member on the side of the first object plane, a curvature radius R4 of a surface of said fourth optical member on the side of the first object plane, a curvature radius R5 of a surface of said fifth optical member on the side of the first object plane, a curvature radius R6 of a surface of said sixth optical member on the side of the first object plane, a curvature radius R7 of a surface of said seventh optical member on the side of the first object plane, and a curvature radius R8 of a surface of said eighth optical member on the side of the first object plane satisfy:

$$R1<R2<R3<R4<R5<R6<R7<R8.$$

9. The system according to claim 6, wherein maximum angles θ1, θ2, θ3, θ4, θ5, θ6, θ7, and θ8 between the optical axis and a light beam which propagates through said first optical member, said second optical member, said third optical member, said fourth optical member, said fifth optical member, said sixth optical member, said seventh optical member, and said eighth optical member satisfy:

$$|\theta i-\theta j|<5^\circ (i, j=1, 2, 3, 4, 5, 6, 7, 8).$$

10. A projection optical system which projects an image on a first object plane onto a second object plane, comprising at least eight optical members which are arrayed in turn from the second object plane, and made of an isotropic crystal, wherein said at least eight optical members are formed by alternately arraying optical members in each of which a <1 1 1> crystal axis is oriented along a direction of an optical axis, and optical members in each of which a <1 0 0> crystal axis is oriented along the direction of the optical axis, and when said at least eight optical members are determined as a first optical member, a second optical member, a third optical member, a fourth optical member, a fifth optical member, a sixth optical member, a seventh optical member, and an eighth optical member in turn from the first object plane, angles Φ1, Φ2, Φ3, Φ4, Φ5, Φ6, Φ7, and Φ8 of said first optical member, said second optical member, said third optical member, said fourth optical member, said fifth optical member, said sixth optical member, said seventh optical member, and said eighth optical member around the optical axis satisfy:

$$\Phi 1=\Phi 5+m\times\eta\pm 5^\circ$$

$$\Phi 2=\Phi 8+n\times\eta\pm 5^\circ$$

$$\Phi 3=\Phi 7+o\times\eta\pm 5^\circ$$

$$\Phi 4=\Phi 6+p\times\eta\pm 5^\circ$$

where m, n, o, and p are integers, and η is 120° if the <1 1 1> crystal axis is oriented along the direction of the optical axis, and η is 90° if the <1 0 0> crystal axis is oriented along the direction of the optical axis.

11. The system according to claim 10, wherein for said first optical member, said second optical member, said third optical member, said fourth optical member, said fifth optical member, said sixth optical member, said seventh optical member, and said eighth optical member, orientation patterns each including the angle around the optical axis and a relationship between the direction of the optical axis and the crystal axis are determined by necklace permutation.

12. The system according to claim 10, wherein a curvature radius R1 of a surface of said first optical member on a side of the first object plane, a curvature radius R2 of a surface of said second optical member on the side of the first object plane, a curvature radius R3 of a surface of said third optical member on the side of the first object plane, a curvature radius R4 of a surface of said fourth optical member on the side of the first object plane, a curvature radius R5 of a surface of said fifth optical member on the side of the first object plane, a curvature radius R6 of a surface of said sixth optical member on the side of the first object plane, a curvature radius R7 of a surface of said seventh optical member on the side of the first object plane, and a curvature radius R8 of a surface of said eighth optical member on the side of the first object plane satisfy:

$$R1<R2<R3<R4<R5<R6<R7<R8.$$

13. The system according to claim 10, wherein maximum angles θ1, θ2, θ3, θ4, θ5, θ6, θ7, and θ8 between the optical axis and a light beam which propagates through said first optical member, said second optical member, said third optical member, said fourth optical member, said fifth optical member, said sixth optical member, said seventh optical member, and said eighth optical member satisfy:

$$|\theta i-\theta j|<5°(i, j=1, 2, 3, 4, 5, 6, 7, 8).$$

14. An exposure apparatus comprising:

an illumination optical system configured to illuminate a reticle with light from a light source; and a projection optical system according to claim 1, which is configured to project a pattern image of the reticle onto a substrate.

15. An exposure apparatus comprising:

an illumination optical system configured to illuminate a reticle with light from a light source; and a projection optical system according to claim 2, which is configured to project a pattern image of the reticle onto a substrate.

16. An exposure apparatus comprising:

an illumination optical system configured to illuminate a reticle with light from a light source; and a projection optical system according to claim 6, which is configured to project a pattern image of the reticle onto a substrate.

17. An exposure apparatus comprising:

an illumination optical system configured to illuminate a reticle with light from a light source; and a projection optical system according to claim 10, which is configured to project a pattern image of the reticle onto a substrate.

18. A device fabrication method comprising steps of:

exposing a substrate using an exposure apparatus according to claim 14; and performing a development process for the substrate exposed.

19. A device fabrication method comprising steps of:

exposing a substrate using an exposure apparatus according to claim 15; and performing a development process for the substrate exposed.

20. A device fabrication method comprising steps of:

exposing a substrate using an exposure apparatus according to claim 16; and performing a development process for the substrate exposed.

21. A device fabrication method comprising steps of:

exposing a substrate using an exposure apparatus according to claim 17; and performing a development process for the substrate exposed.

* * * * *